United States Patent
Takagi

(10) Patent No.: US 9,796,579 B2
(45) Date of Patent: Oct. 24, 2017

(54) MANUFACTURING METHOD OF ELECTRONIC DEVICE, ELECTRONIC DEVICE, ELECTRONIC APPARATUS, AND MOVING BODY

(71) Applicant: Seiko Epson Corporation, Tokyo (JP)

(72) Inventor: Shigekazu Takagi, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/251,423

(22) Filed: Aug. 30, 2016

(65) Prior Publication Data
US 2017/0073219 A1    Mar. 16, 2017

(30) Foreign Application Priority Data

Sep. 10, 2015  (JP) ................. 2015-178230

(51) Int. Cl.
  *B81B 7/00*   (2006.01)
  *B81C 1/00*   (2006.01)

(52) U.S. Cl.
  CPC ........ *B81B 7/0051* (2013.01); *B81C 1/00325* (2013.01); *B81C 2201/013* (2013.01); *B81C 2201/053* (2013.01); *B81C 2203/031* (2013.01)

(58) Field of Classification Search
  CPC .......... B81B 3/00; B81B 7/00; B81B 7/0032; B81B 7/0035; B81B 7/0041; B81B 2203/01–2203/019; B81C 1/00269; B81C 1/00277; B81C 1/00293; B81C 2203/031; B81C 2203/0109; B81C 2203/0145; B81C 2201/0101; B81C 2201/0128; B81C 2201/013

See application file for complete search history.

(56) References Cited

U.S. PATENT DOCUMENTS

| | | | | |
|---|---|---|---|---|
| 5,591,679 A | * | 1/1997 | Jakobsen | B81C 1/00301 148/DIG. 12 |
| 6,528,724 B1 | * | 3/2003 | Yoshida | B81C 1/0015 174/541 |
| 7,204,737 B2 | * | 4/2007 | Ding | B81B 7/007 445/23 |

(Continued)

FOREIGN PATENT DOCUMENTS

| | | |
|---|---|---|
| JP | 2010-143792 A | 7/2010 |
| JP | 2010-223599 A | 10/2010 |

(Continued)

*Primary Examiner* — Scott B Geyer
(74) *Attorney, Agent, or Firm* — Harness, Dickey & Pierce, P.L.C.

(57) ABSTRACT

A manufacturing method of an electronic device includes a process that forms a protective layer on at least a portion of the first base body to which a third base body is to be bonded, a process that performs first bonding of a second base body to the first base body, a process that performs a first etching of the second base body bonded by the first bonding, a process that removes the protective layer using a second etching, and a process that performs second bonding of the third base body to the first base body. In the first etching, an etching rate of the second base body is faster than those of the first base body and the protective layer, and in the second etching, an etching rate of the protective layer is faster than those of the first base body and the second base body.

14 Claims, 12 Drawing Sheets

(56) References Cited

U.S. PATENT DOCUMENTS

| | | | |
|---|---|---|---|
| 7,393,758 B2* | 7/2008 | Sridhar | B81C 1/00301 257/684 |
| 9,144,159 B2 | 9/2015 | Takagi | |
| 2004/0195638 A1* | 10/2004 | Fischer | B81B 7/0006 257/417 |
| 2006/0105503 A1* | 5/2006 | Ding | B81B 7/007 438/125 |
| 2007/0099395 A1* | 5/2007 | Sridhar | B81C 1/00301 438/460 |
| 2010/0061073 A1* | 3/2010 | Oldsen | B81B 3/0051 361/807 |
| 2012/0111615 A1* | 5/2012 | Yoda | G01P 15/0802 174/257 |
| 2013/0265701 A1* | 10/2013 | Takizawa | H05K 5/069 361/679.01 |
| 2014/0070339 A1* | 3/2014 | Marx | B81B 7/0041 257/415 |
| 2016/0130135 A1* | 5/2016 | Kamisuki | B81C 1/00873 257/415 |
| 2017/0050843 A1* | 2/2017 | Naruse | B81C 1/00269 |

FOREIGN PATENT DOCUMENTS

| | | |
|---|---|---|
| JP | 2011-143479 A | 7/2011 |
| JP | 2013-164285 A | 8/2013 |
| JP | 2015-031513 A | 2/2015 |

* cited by examiner

MANUFACTURING METHOD OF ELECTRONIC DEVICE, ELECTRONIC DEVICE, ELECTRONIC APPARATUS, AND MOVING BODY

BACKGROUND

1. Technical Field

The present invention relates to a manufacturing method of an electronic device, an electronic device, an electronic apparatus, and a moving body.

2. Related Art

In the related art, for example, acceleration sensors, gyro sensors, and the like in which functional elements that are formed from silicon substrates, and the like, are provided on package substrates (base bodies) such as semiconductor substrates or glass substrates, have been proposed as electronic devices that are provided with functional elements which detect physical quantities using silicon Micro Electro Mechanical Systems (MEMS).

For example, JP-A-2013-164285 discloses an electronic device, which is provided with a lid that is joined to a first surface side of a base body (equivalent to the above-mentioned package substrate) and a functional element (a sensor element) that is stored in a cavity, which is surrounded by the base body and the lid, and a manufacturing method thereof. Further, in the manufacturing method of an electronic device, after forming a functional element through an etching process of a silicon substrate which is anodically bonded (a first repetition) to a base body, a lid is anodically bonded (a second repetition) to the base body encapsulating the functional element. In other words, in the manufacturing process of the electronic device, a processing treatment such as an etching process is performed after a first repetition of anodic bonding, and a second repetition of anodic bonding is performed thereafter. That is, in the manufacturing process of the electronic device, a plurality of repetitions of anodic bonding are performed before and after a processing treatment such as an etching process.

However, when, in the manner disclosed in JP-A-2013-164285, an etching process for forming a functional element is performed after anodic bonding (a first repetition) of a base body and a silicon substrate, which corresponds to the functional element, the outer surface of the substrate on which a second repetition of anodic bonding is performed becomes rough, uneven portions are increased in size, and therefore, flatness is impaired. When an attempt is made to anodically bond (a second repetition) a lid to an outer surface of a substrate in which flatness is impaired in this manner, bonding of the lid and a base body is not performed sufficiently, consequently, the bonding strength of the lid and the base body is reduced, the bonding state is unstable, or the like, and there is a concern that the airtightness between the lid and the base body will be reduced as a result.

SUMMARY

The invention can be realized as the following aspects or application examples.

Application Example 1

According to this application example, there is provided a manufacturing method of an electronic device that includes a process that respectively bonds a second base body which includes silicon, and a third base body which includes silicon, to a first base body which includes an alkali metal ion, the method including a process that prepares the first base body, a process that forms a protective layer on at least a portion of the first base body to which the third base body is to be bonded, a process that performs first bonding of the second base body to the first base body, a process that performs a first etching of the second base body bonded by the first bonding, a process that removes the protective layer using a second etching, and a process that performs second bonding of the third base body to the first base body, in which, in the first etching, an etching rate of the second base body is faster than those of the first base body and the protective layer, and, in the second etching, an etching rate of the protective layer is faster than those of the first base body and the second base body.

According to the application example, even if the first etching process is performed on the second base body, which is bonded (a first repetition) to the first base body using the protective layer, which is provided on the first base body to which the third base body is to be bonded, it is possible to suppress a circumstance in which the outer surface of the first base body, to which the third base body is to be bonded, becomes rough, uneven portions are increased in size, and flatness is impaired as a result. Further, it is possible to sufficiently perform bonding of the first base body and the third base body by bonding the third base body to the first base body (a surface in which flatness is not impaired) from which the protective layer was removed. In other words, it is possible to suppress a circumstance in which the bonding strength of the first base body and the third base body is reduced, the bonding state is unstable, or the like, due to the flatness of the first base body being impaired.

Additionally, in the first etching that is performed on the second base body, which is bonded to the first base body, since the etching rate of the second base body is faster than those of the first base body and the protective layer, it is possible to suppress damage to the first base body and the protective layer. In addition, in the second etching, which removes the protective layer, since the etching rate of the protective layer is faster than those of the first base body and the second base body, it is possible to remove the protective layer in a centralized manner.

Application Example 2

In the manufacturing method of an electronic device according to the application example, it is preferable that, in the process that forms the protective layer, the protective layer is formed in circuit form.

According to the application example, by forming the protective layer in circuit form, it is also possible to configure an unroughened surface (bonding surface) of the first base body in circuit form. Accordingly, since it is also possible to perform bonding of the first base body and the third base body in circuit form, it is possible to stably perform bonding of an outer periphery in which the second base body is set as an inner side.

Application Example 3

In the manufacturing method of an electronic device according to the application example, it is preferable that, in the process that forms the protective layer, the protective layer is formed using a diamond-like carbon (DLC) film.

According to the application example, a diamond-like carbon (DLC) film is generally used in processing of silicon substrates, or the like, and it is possible to form the protective layer without performing a dedicated process. Additionally, the DLC film is hard, the adhesive properties thereof with respect to a silicon substrate are favorable, and the DLC film is resistant to dry etching gases. Further, for example, it is even possible to easily perform the removal using oxygen plasma, or the like.

Application Example 4

In the manufacturing method of an electronic device according to the application example, it is preferable that, in the second base body, a relief groove section is provided in a region of the second base body that overlaps with the protective layer in plan view, on a bonding surface with the first base body, and, in the process that performs the first bonding, anodic bonding is performed by disposing the protective layer inside the relief groove section.

According to the application example, since it is possible to avoid the protective layer using the relief groove section, it is possible to bond the second base body to the first base body in a state in which the protective layer is provided. As a result of this, it is possible to perform bonding in a state in which a plurality of second base bodies are connected.

Application Example 5

In the manufacturing method of an electronic device according to the application example, it is preferable that, in the process that performs the first bonding, the second base body is bonded to the first base body using anodic bonding.

According to the application example, the bonding strength is increased as a result of the second base body being anodically bonded to the first base body, and therefore, it is possible to perform stable bonding. As a result of this, it is possible to perform etching, or the like, on the second base body.

Application Example 6

In the manufacturing method of an electronic device according to the application example, it is preferable that, in the process that performs the second bonding, the third base body is bonded to the first base body using anodic bonding.

According to the application example, the bonding strength is increased as a result of the third base body being anodically bonded to the first base body, and therefore, it is possible to perform stable bonding. As a result of this, it is possible to reliably perform hermetic sealing using the third base body.

Application Example 7

According to this application example, there is provided an electronic device including a first base body that includes an alkali metal ion, a second base body that is anodically bonded to the first base body; and a third base body that is anodically bonded to the first base body in which the first base body is provided with a first surface, which includes a bonding portion with the third base body, and a second surface having a more pronounced rough surface state than the first surface, in at least a portion of a peripheral region of the first surface.

According to the application example, a second surface having a more pronounced rough surface state than the first surface is provided in a peripheral region of the first surface, which includes a bonding portion of the first base body and the third base body. In other words, the first surface, which includes the bonding portion of the first base body and the third base body, is configured so that the surface roughness thereof is less than that of the peripheral region thereof. Accordingly, it is possible to stabilize the bonding of the first base body and the third base body, and therefore, it is also possible to increase the bonding strength.

Additionally, a rough surface state refers to a state in which the distortion in surface height due to uneven portions of the surface being large, and in which so-called surface roughness is large (coarse).

Application Example 8

In the electronic device according to the application example, it is preferable that, in the peripheral region of the first surface, the second surface is provided between the third base body, which is bonded to the first base body, and the second base body, which is bonded to the first base body.

According to the application example, the third base body can be bonded to the first base body encapsulating the second base body without coming into contact with the functional element due to a space that is caused by a region of the second surface having a more pronounced rough surface state than the first surface.

Application Example 9

In the electronic device according to the application example, it is preferable that the first surface includes bonding surface of the third base body on an inner side thereof in plan view.

According to the application example, since the third base body is bonded to the first base body on the first surface in which surface roughness is small, it is possible to stabilize bonding of the third base body and the first base body, and therefore, it is possible to increase the bonding strength.

Application Example 10

According to this application example, there is provided an electronic apparatus including the electronic device according to the above-mentioned application example.

According to the application example, since the electronic apparatus is provided with an electronic device in which the bonding strength of the first base body and third base body is enhanced and stabilized bonding is performed, it is possible to configure an electronic apparatus in which reliability is improved.

Application Example 11

According to this application example, there is provided a moving body including the electronic device according to the above-mentioned application example.

According to the application example, since the moving body is provided with an electronic device in which the bonding strength of the first base body and third base body is enhanced and stabilized bonding is performed, it is possible to configure a moving body in which reliability is improved.

BRIEF DESCRIPTION OF THE DRAWINGS

The invention will be described with reference to the accompanying drawings, wherein like numbers reference like elements.

DESCRIPTION OF EXEMPLARY EMBODIMENT

Hereinafter, an embodiment of the invention will be described. Additionally, the present embodiment, which is described below, does not unreasonably limit the content of the invention that is disclosed in the claims. In addition, not necessarily all of the configurations that are described in the present embodiment are indispensable constituent features of the invention. In addition, hereinafter, for convenience of description in each drawing, an X axis, a Y axis and a Z axis will be illustrated as three axes that are orthogonal to one another, a direction that is parallel to the X axis will be referred to as an "X axis direction", a direction that is parallel to the Y axis will be referred to as a "Y axis direction", and a direction that is parallel to the Z axis will be referred to as a "Z axis direction". In addition, a +Z axis direction refers to "up" or "upward", and a −Z axis direction refers to "down" or "downward"

Embodiment

Figure 1:
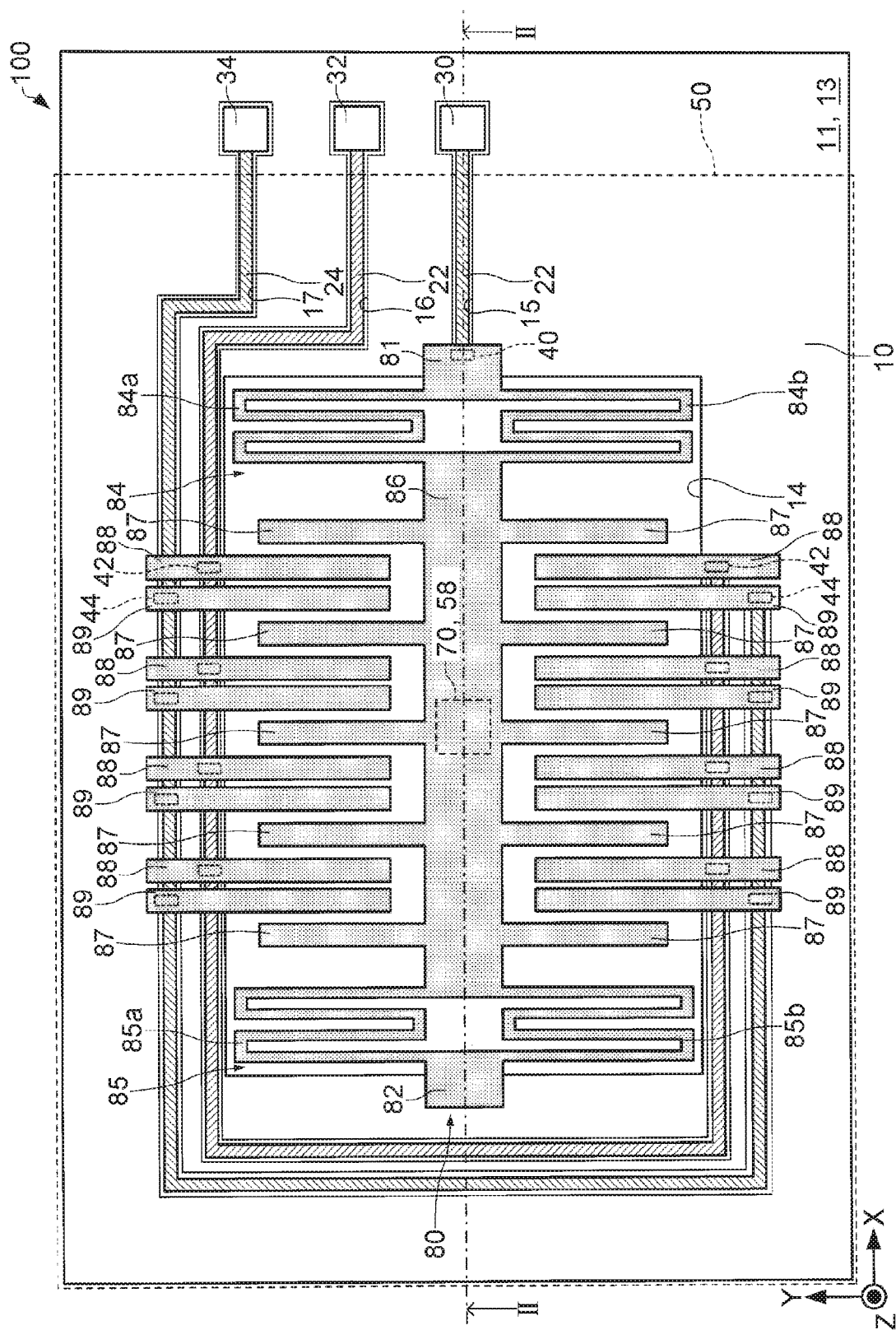
FIG. 1 is a plan view that schematically shows an outline configuration of an acceleration sensor as an example of an electronic device.
Figure 2:
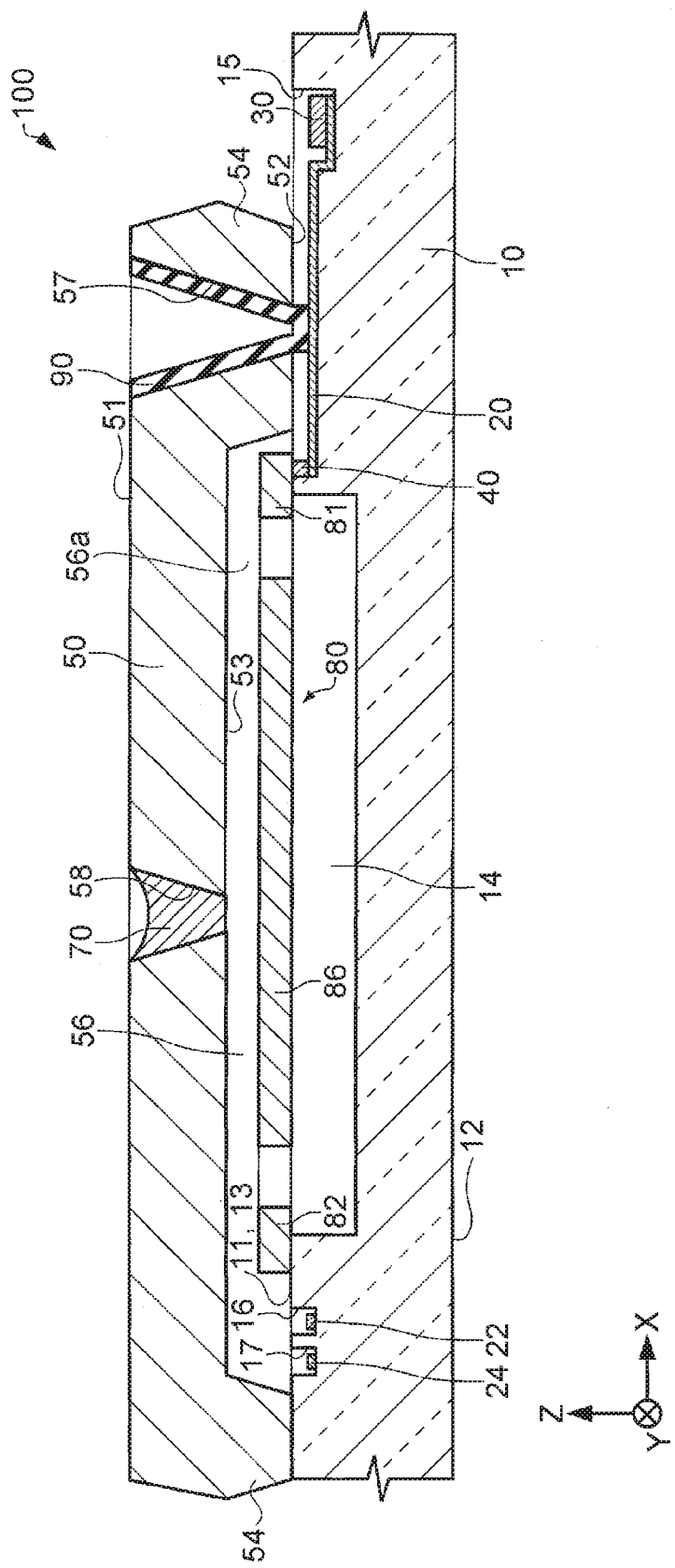
FIG. 2 is a front cross-sectional view along a line II-II in FIG. 1, which schematically shows the acceleration sensor.
Figure 3A:
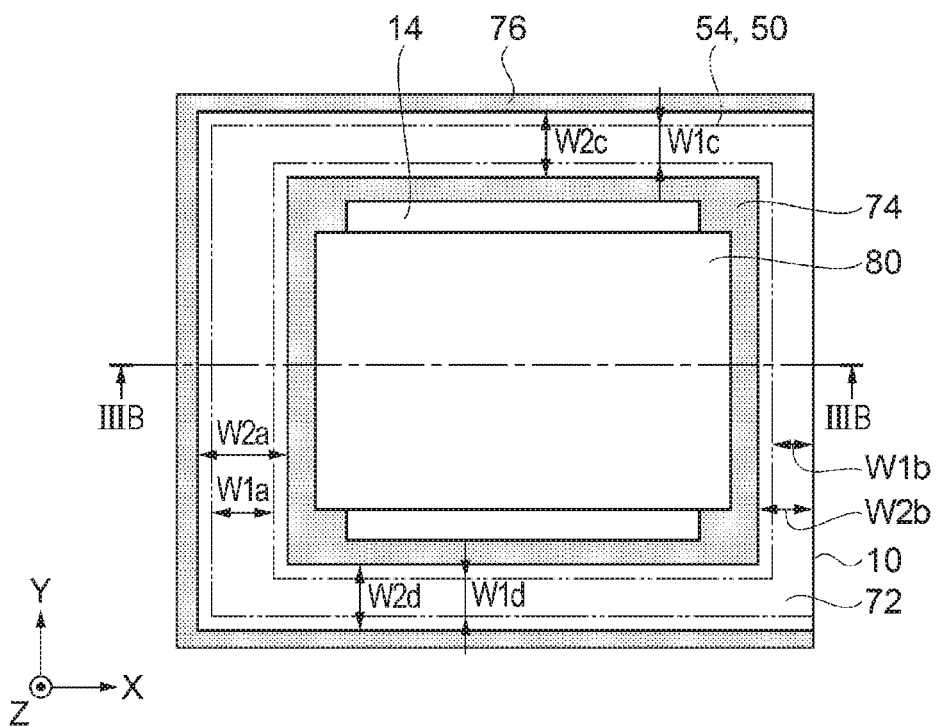
FIG. 3A is a plan view that schematically shows a bonding portion of a base body and a lid.
Figure 3B:
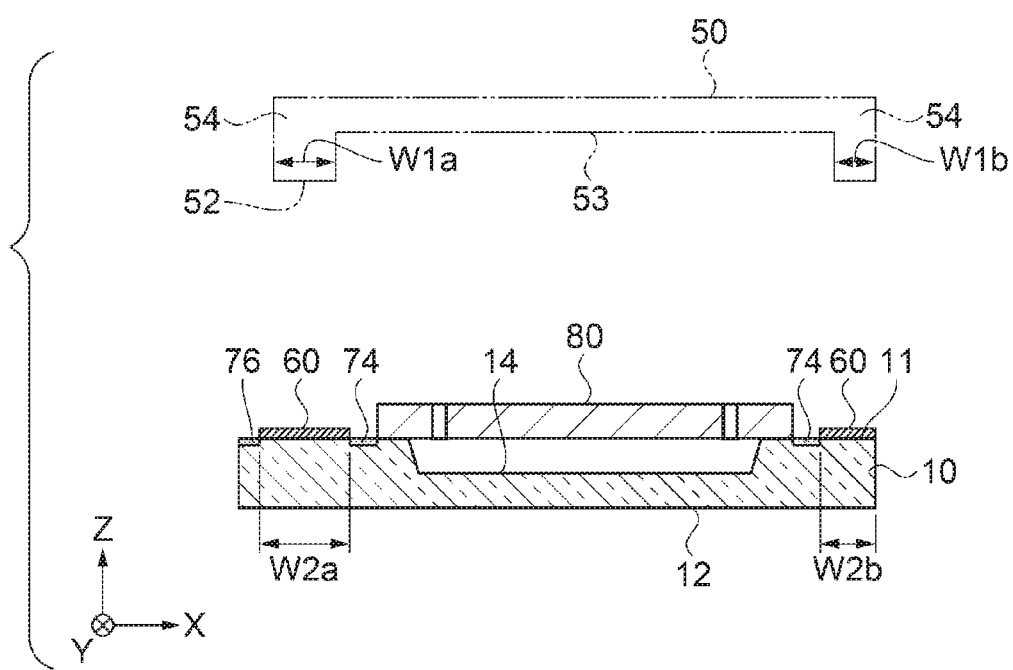
FIG. 3B is a front cross-sectional view along a line IIIB-IIIB in FIG. 3A, which schematically shows the bonding portion of the base body and the lid.
Figure 4:
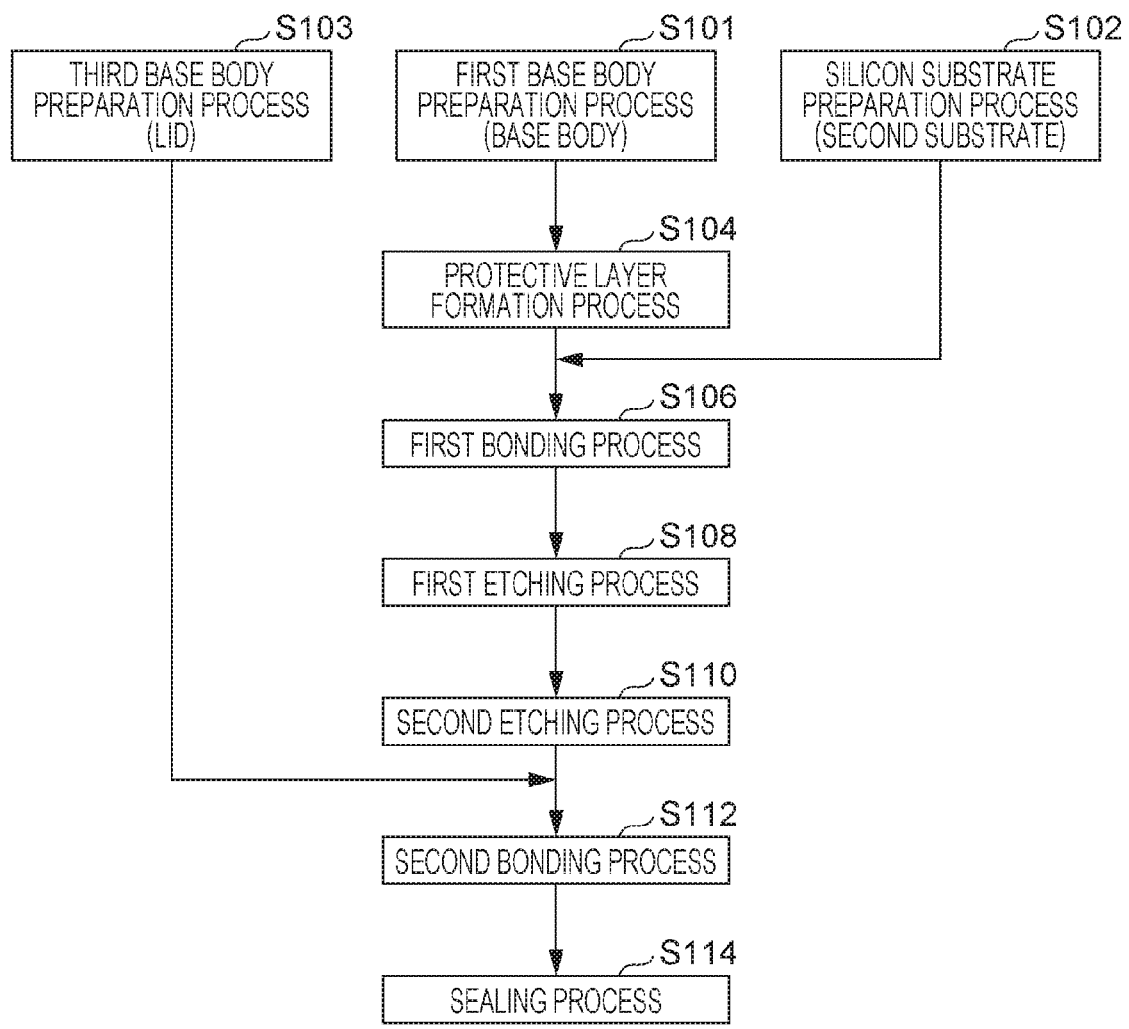
FIG. 4 is a flowchart that shows an outline of a manufacturing method of an electronic device according to the present embodiment.
Figure 5A:
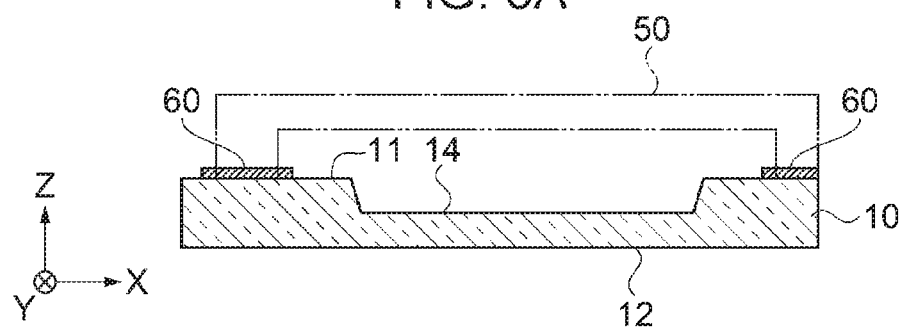
FIG. 5A is a process flow-1 (a front cross-sectional view) that shows the manufacturing method of an electronic device according to the present embodiment.
Figure 5B:
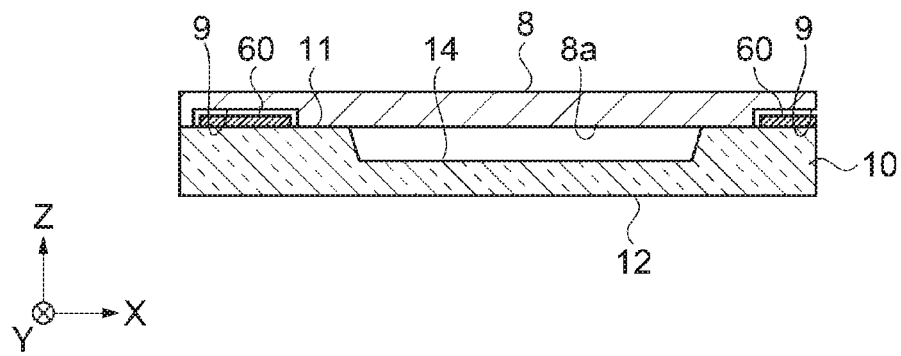
FIG. 5B is a process flow-2 (a front cross-sectional view) that shows the manufacturing method of an electronic device.
Figure 5C:
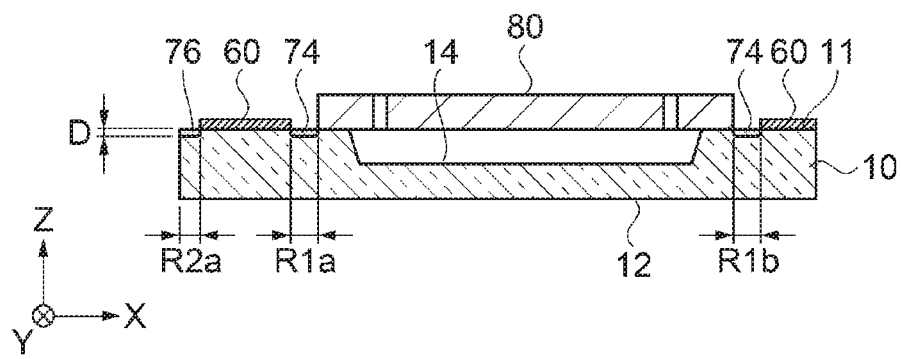
FIG. 5C is a process flow-3 (a front cross-sectional view) that shows the manufacturing method of an electronic device.
Figure 5D:
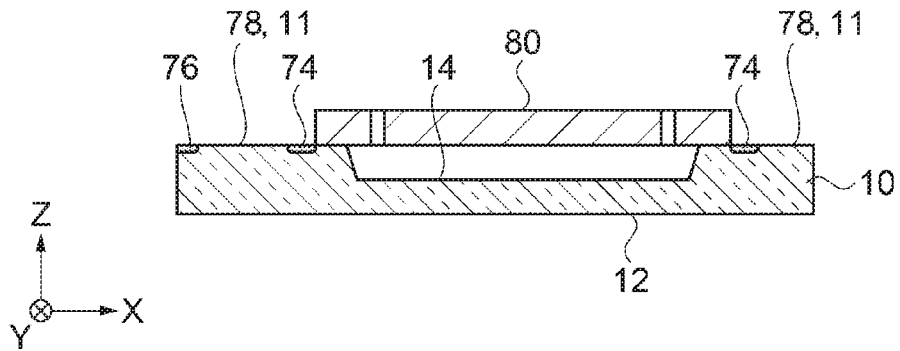
FIG. 5D is a process flow-4 (a front cross-sectional view) that shows the manufacturing method of an electronic device.
Figure 5E:
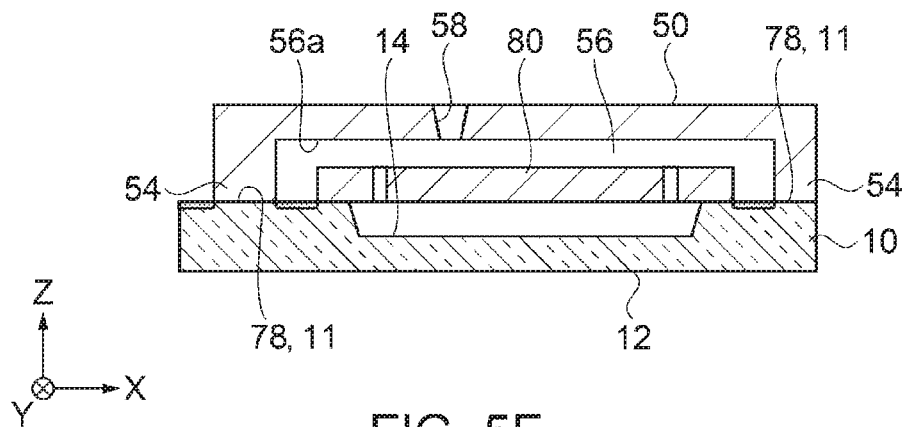
FIG. 5E is a process flow-5 (a front cross-sectional view) that shows the manufacturing method of an electronic device.
Figure 5F:
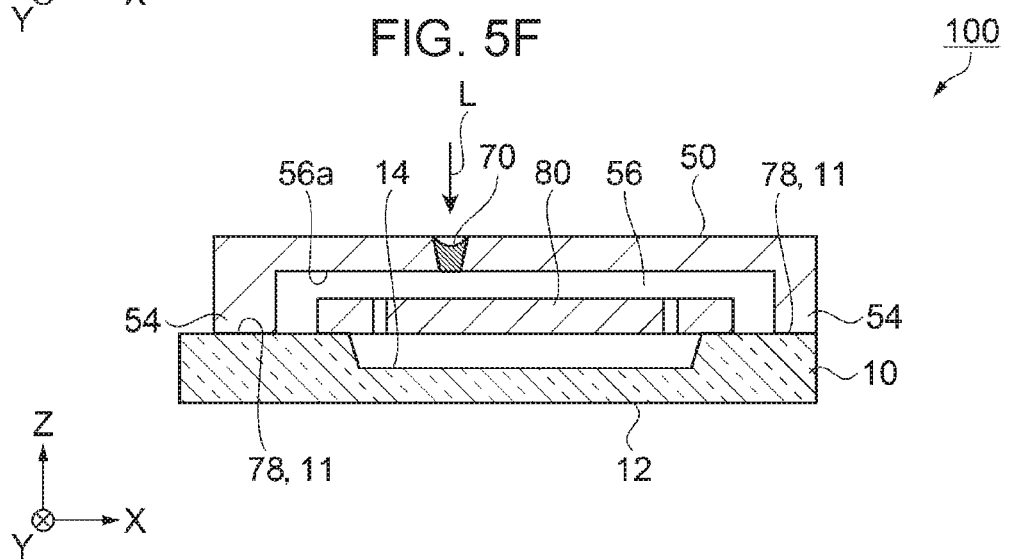
FIG. 5F is a process flow-6 (a front cross-sectional view) that shows the manufacturing method of an electronic device.
Figure 6:
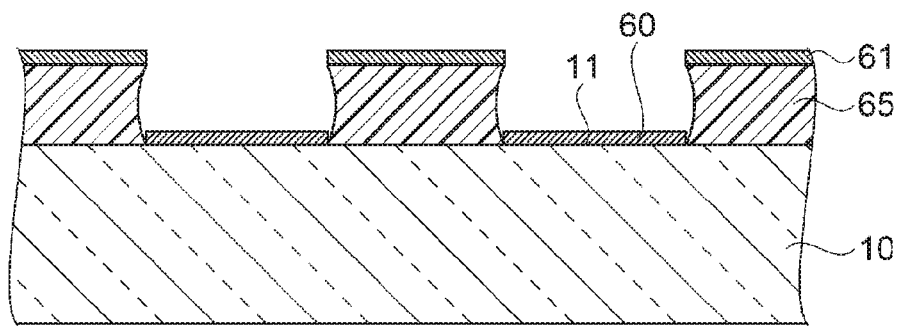
FIG. 6 is a front cross-sectional view that shows an example of a method of formation of a protective film.
Figure 7:
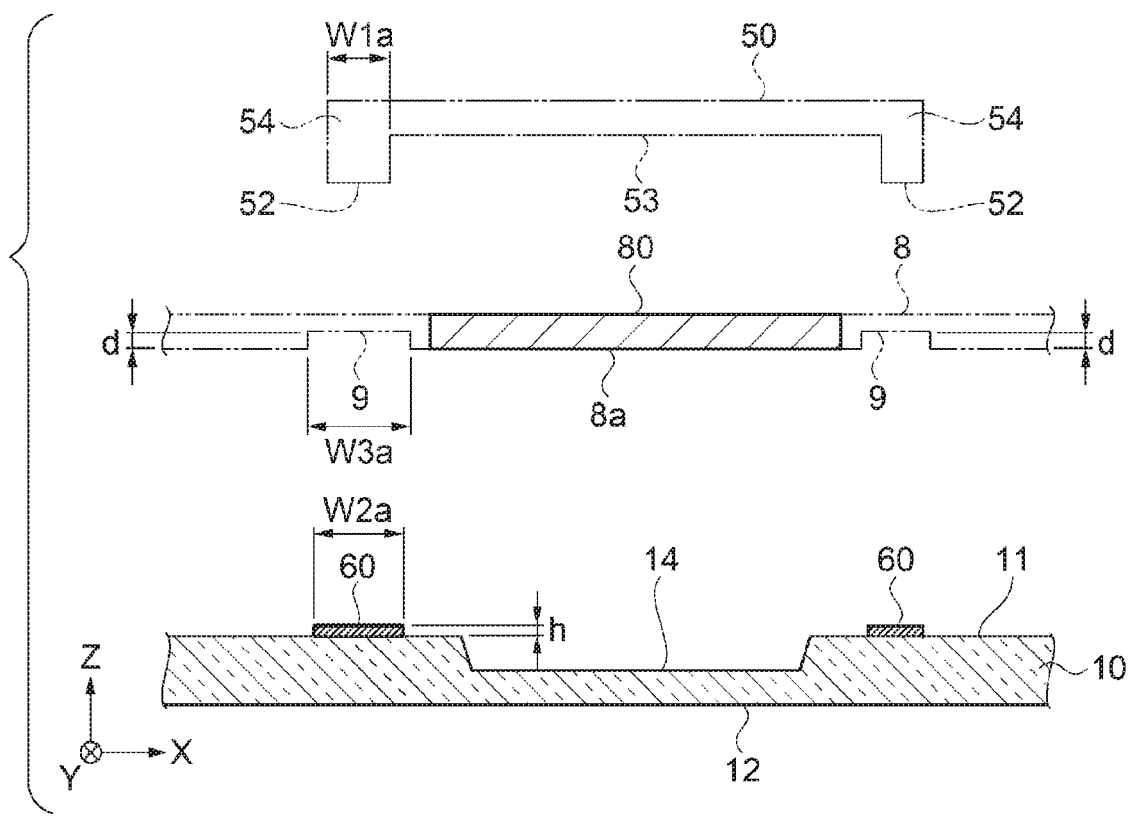
FIG. 7 is a front cross-sectional view that schematically shows a relationship between the lid, the protective film and a relief section (a recessed section).

An electronic device and a manufacturing method of an electronic device according to the embodiment of the invention will be described using FIG. 1, FIG. 2, FIG. 3A, FIG. 3B, FIG. 4, FIG. 5A to FIG. 5F, FIG. 6 and FIG. 7. FIG. 1 and FIG. 2 schematically show an electronic device according to the embodiment of the invention, FIG. 1 is a plan view, and FIG. 2 is a front cross-sectional view along a line II-II in FIG. 1. FIG. 3A and FIG. 3B schematically show a bonding portion of a base body and a lid in the electronic device according to the present embodiment, FIG. 3A is a plan view, and FIG. 3B is a front cross-sectional view along a line IIIB-IIIB in FIG. 3A. FIG. 4 is a flowchart that shows an outline of a manufacturing method of an electronic device according to the present embodiment. FIG. 5A to FIG. 5F are process flow views that show the manufacturing method of an electronic device according to the present embodiment (front cross-sectional views that schematically show the electronic device in each process), FIG. 5A shows a process flow-1, FIG. 5B shows a process flow-2, FIG. 5C shows a process flow-3, FIG. 5D shows a process flow-4, FIG. 5E shows a process flow-5, and FIG. 5F shows a process flow-6. FIG. 6 is a front cross-sectional view that shows an example of a method of formation of a protective film. FIG. 7 is a front cross-sectional view that schematically shows a relationship between the lid, the protective film and a relief section (a recessed section).

1. Electronic Devices

Firstly, the electronic device according to the present embodiment will be described with reference to FIG. 1, FIG. 2, FIG. 3A and FIG. 3B. As shown in FIG. 1 and FIG. 2, an electronic device 100 according to the present embodiment includes a base body (a first base body) 10, a groove section 15, wiring 20, an external connection terminal 30, a lid (a third base body) 50, and a functional element (a second base body) 80. Furthermore, the electronic device 100 can include groove sections 16 and 17, wiring 22 and 24, external connection terminals 32 and 34, a second through hole 58, a sealing member 70, a first through hole 57, and a filling member 90. Additionally, for the sake of convenience, FIG. 1 is illustrated seeing through the lid 50 and the sealing member 70.

For example, the material of the base body 10, as the first base body, is glass (borosilicate glass) or silicon. As shown in FIG. 2, the base body 10 has an outer (front) surface 11 and a rear surface 12 that is on the opposite side to the outer surface 11. A recessed section 14 is provided on the outer surface 11. A movable section 86 and a movable electrode sections 87 of the functional element 80, as the second base body, are disposed above the recessed section 14, and due to the recessed section 14, the movable section 86 and the movable electrode sections 87 can be moved in a predetermined direction without obstructing the base body 10. The planar form (the shape when viewed from the Z axis direction) of the recessed section 14 is not particularly limited, but is an oblong form in the present example.

The groove section 15 is provided on the outer surface 11 of the base body 10. The groove section 15 extends from an inner side of a cavity 56, which is surrounded by the base body 10 and the lid 50, to an outer side thereof. For example, the groove section 15 has a planar form that corresponds to the planar forms of the wiring 20 and the external connection terminal 30.

In the same manner, the groove sections 16 and 17 are provided on the outer surface 11 of the base body 10. In the example that is shown in FIG. 1, the groove sections 16 and 17 are provided in a manner that follows the outer periphery of the recessed section 14. The groove sections 16 and 17 extend from the inner side of the cavity 56 to the outer side thereof. For example, the groove section 16 has a planar form that corresponds to the planar forms of the wiring 22 and the external connection terminal 32. For example, the groove section 17 has a planar form that corresponds to the planar forms of the wiring 24 and the external connection terminal 34.

The depths (the sizes in the Z axis direction) of the groove sections 15, 16 and 17 are greater than the thicknesses (the sizes in the Z axis direction) of the wiring 20, 22 and 24 and the external connection terminals 30, 32 and 34. As a result of this, it is possible to prevent a circumstance in which the wiring 20, 22 and 24 and the external connection terminals 30, 32 and 34 protrude further upward (in the +Z direction) than the outer surface 11.

The wiring 20 is provided inside the groove section 15. More specifically, the wiring 20 is provided on a surface of the base body 10 that defines the bottom surface of the groove section 15. The wiring 20 is electrically connected to the functional element 80 and the external connection terminal 30. In the illustrated example, the wiring 20 is connected to a fixing section 81 of the functional element 80 through a contact section 40, which is provided inside the groove section 15.

The wiring 22 is provided inside the groove section 16. More specifically, the wiring 22 is provided on a surface of the base body 10 that defines the bottom surface of the groove section 16. The wiring 22 is electrically connected to the functional element 80 and the external connection terminal 32. In the illustrated example, the wiring 22 is connected to a fixing section 88 of the functional element 80 through a contact section 42.

The wiring 24 is provided inside the groove section 17. More specifically, the wiring 24 is provided on a surface of the base body 10 that defines the bottom surface of the groove section 17. The wiring 24 is electrically connected to the functional element 80 and the external connection terminal 34. In the illustrated example, the wiring 24 is connected to a fixing section 89 of the functional element 80 through a contact section 44.

The external connection terminal 30 is provided on the outer surface 11 of the base body 10. In the example that is shown in FIG. 2, the external connection terminal 30 is provided on the wiring 20, which is inside the groove section 15. The external connection terminal 30 is disposed on an outer side of the cavity 56. That is, the external connection terminal 30 is provided in a position that does not overlap with the lid 50.

In the same manner, the external connection terminals 32 and 34 are provided on the outer surface 11 of the base body 10. For example, the external connection terminal 32 is provided on the wiring 22, which is inside the groove section 16, and the external connection terminal 34 is provided on the wiring 24, which is inside the groove section 17. The external connection terminals 32 and 34 are disposed on an outer side of the cavity 56. In the example that is shown in FIG. 1, the external connection terminals 30, 32 and 34 are disposed aligned along the Y axis.

For example, the materials of the wiring 20, 22 and 24 and the external connection terminals 30, 32 and 34 are Indium Tin Oxide (ITO), aluminum, gold, platinum, titanium, tungsten, chromium, and the like. For example, the materials of the contact sections 40, 42 and 44 are gold, copper, aluminum, platinum, titanium, tungsten, chromium, and the like. For example, in a case in which the base body 10 is transparent when the materials of the wiring 20, 22 and 24 and the external connection terminals 30, 32 and 34 are transparent electrode materials such as ITO, for example, it is possible to visually recognize foreign matter that is present on the wiring 20, 22 and 24, on the external connection terminals 30, 32 and 34, or the like, with ease from a rear surface 12 side of the base body 10.

Additionally, in the above description, an electronic device 100 that is provided with three pieces of wiring 20, 22 and 24 and three external connection terminals 30, 32 and 34 is described as an example, but the numbers of the wiring and external connection terminals can be changed as appropriate depending on the shape and number of the functional elements 80.

The lid 50, as the third base body, is mounted on the outer surface 11 of the base body 10. The lid 50 has a third surface 51, and a fourth surface 52 that is on the opposite side to the third surface 51. The fourth surface 52 can include an outer peripheral edge section 54, which is a portion that is bonded to the base body 10 (a bonding surface 13). A recessed section 56a, which forms the cavity 56, is provided on the fourth surface 52, and as a result of this, the lid 50 can have a fifth surface 53, which defines the cavity 56 that encapsulates the functional element 80. As shown in FIG. 3A and FIG. 3B, the lid 50 is bonded to the base body 10 as a result of the fourth surface 52 and a bonding surface 72, as a first surface inside the outer surface 11 of the base body 10, being bonded.

As shown in FIG. 3A and FIG. 3B, the bonding surface 72, as the first surface, is a region in which a protective layer 60 is provided on the base body 10, and is a region (the outer surface 11 of the base body 10) from which the protective layer 60 is removed. As a result of the protective layer 60, the bonding surface 72 is a site that maintains an outer surface state (a surface state having high flatness) in which the outer surface 11 of the base body 10 is generally given a mirror finish without change when forming the functional element (the second base body) 80, which will be described later. In other words, rough surfaces (second surfaces) 74 and 76 having a coarser surface state (a rougher surface state) than the bonding surface 72 are provided in a peripheral region of the bonding surface 72. Additionally, in the present example, the rough surface (the second surface) 74 that is provided between the functional element 80, which is bonded to the base body 10, and the lid 50, which is bonded to the base body 10, and the rough surface (the second surface) 76 that is provided on an outer peripheral side of the lid 50, which is bonded to the base body 10, are included. In this instance, as a result of the rough surface (the second surface) 74 being provided between the functional element 80, which is bonded to the base body 10, and the lid 50, which is bonded to the base body 10, the lid 50 can be bonded to the base body 10 without coming into contact with the functional element 80 due to a space that is caused by a region of the rough surface (the second surface) 74.

Additionally, in the rough surfaces 74 and 76, the above-mentioned coarse surface state or rough surface state can refer to a surface state in a state in which variations in surface height due to uneven portions of a surface, are large, and so-called surface roughness is large (coarse), and can be visually recognized as a so-called pearskin finish state, or a white turbid state (a so-called cloudy glass state) which is not a mirror surface. In other words, it is possible to discriminate between the rough surfaces 74 and 76 and the bonding surface 72 using differences in the transparent appearance when the base body 10 is viewed in a planar manner. Additionally, it is also possible to discriminate using a measuring machine such as a surface roughness tester.

As shown in FIG. 3A, the bonding surface 72 is provided in a circuit form that surrounds the outer periphery of the functional element (the second base body) 80 in plan view when viewed from the Z axis direction. Width dimensions W2$a$ to W2$d$ of the bonding surface 72 are configured to be dimensions that are the width dimensions W1$a$ to W1$d$ of the fourth surface 52 of the lid 50, or more (W1$a$≤W2$a$, W1$b$≤W2$b$, W1$c$≤W2$c$, and W1$d$≤W2$d$). In other words, in plan view, the bonding surface 72 includes the fourth surface 52, which is the bonding surface of the lid 50, on the inner side thereof. As a result of configuring in this manner, the surface of the base body 10, which the fourth surface 52 of the lid 50 is bonded to, has a surface state in which flatness is high, the stability of the bonding of the lid 50 and the base body 10 is enhanced, and therefore, it is also possible to enhance the bonding strength.

Additionally, it is more preferable that the width dimensions W2$a$ to W2$d$ of the bonding surface 72 are configured to be wider than the width dimensions W1$a$ to W1$d$ of the fourth surface 52 of the lid 50 (W1$a$<W2$a$, W1$b$<W2$b$, W1$c$<W2$c$, and W1$d$<W2$d$). Further, the fourth surface 52 of the lid 50 is disposed inside the bonding surface 72. As a result of configuring in this manner, even if there is variation in the disposition position of the lid 50, it is possible to bond to the inside of the bonding surface 72, which has high flatness, and therefore, it is possible to further improve the bonding stability.

In addition, as shown in FIG. 2, the lid 50 is disposed separated from the wiring 20 as a result of the wiring 20 being provided inside the groove section 15. More specifically, the fourth surface 52 of the lid 50 includes a portion that is disposed facing the wiring 20 with an air space therebetween. In the same manner, the fourth surface 52 may include a portion that is disposed facing the wiring 22 and 24 with air spaces therebetween.

For example, it is possible to use silicon, glass, or the like as the material of the lid 50. For example, in a case in which the material of the base body 10, as the first base body, is a glass that includes an alkali metal ion, and the material of the lid 50, as the third base body, is silicon, it is possible to use an anodic bonding technique as the bonding method of the lid 50 and the base body 10. In the present embodiment, the base body 10 and the lid 50 are bonded using a second repetition of anodic bonding (a second bonding process that will be described later). As a result of this, in the anodic bonding of the lid 50, which encapsulates the functional element 80, it is possible to obtain a more stabilized bonding strength.

The base body 10 and the lid 50 can configure a package. The base body 10 and the lid 50 can form the cavity 56, and therefore, can accommodate the functional element 80 in the cavity 56. For example, the cavity 56 is sealed in an inert gas (for example, nitrogen gas) atmosphere, a reduced pressure state, or the like.

The first through hole 57 is provided in the lid 50. The first through hole 57 is not illustrated in the drawings, but is provided in a position that overlaps with the groove sections 15, 16 and 17 in plan view (when viewed from the Z axis direction). In the present example, the first through hole 57 is provided above the groove sections 15, 16 and 17 (above the wiring 20, 22 and 24).

As shown in FIG. 2, the first through hole 57 is provided from the third surface 51 of the lid 50 up to the fourth surface 52, and penetrates through the lid 50 in the Z axis direction. For example, it is preferable that the first through hole 57 has a tapered shape in which an opening diameter thereof becomes smaller with progression toward a base body 10 side (with progression toward the fourth surface 52 from the third surface 51). In this kind of form, it is easy to form a film up to the bottom of the hole when forming the filling member 90 (to be described later).

Additionally, in the illustrated example, a single first through hole 57, which overlaps with the groove sections 15, 16 and 17 in plan view, is provided, but a plurality of through holes may be provided to correspond to a plurality of groove sections 15, 16 and 17. For example, in this kind of form, it is possible to make a bonding area of the base body 10 and the lid 50 greater, and therefore, it is possible to increase the bonding strength.

As shown in FIG. 2, the filling member 90 is provided inside the first through hole 57 and inside the groove sections 15, 16 and 17, and is embedded in the groove sections 15, 16 and 17. In the example that is shown in FIG. 2, the filling member 90 is embedded in a portion of the groove section 15. For example, the filling member 90 is provided along an inner surface of the first through hole 57 (a surface of the lid 50, which defines the first through hole 57), and is in contact with the wiring 20, 22 and 24 and the outer surface 11 of the base body 10. Although not illustrated in the drawings, the filling member 90 may be provided so as to be completely embedded in the first through hole 57. The cavity 56 is sealed by the filling member 90. For example, an insulation film such as a silicon oxide film (more specifically, a Tetra Ethyl Ortho Silicate (TEOS) film), or a silicon nitride (SiN) film is used as the filling member 90.

The second through hole 58 is provided from the third surface 51 of the lid 50 up to the fifth surface 53, and penetrates through the lid 50 in the Z axis direction. The second through hole 58 is in communication with the cavity 56. For example, it is preferable that the second through hole 58 has a tapered shape in which an opening diameter thereof becomes smaller with progression toward the base body 10 side (with progression toward the fifth surface 53 from the third surface 51). In this kind of form, it is possible to prevent solder balls (to be described later) from falling during melting of solder balls. In addition, it is possible to perform sealing more reliably due to a structure in which an opening area becomes more narrow with progression toward a cavity 56 side.

The sealing member 70 is provided inside the second through hole 58, and blocks the second through hole 58. The cavity 56 is sealed by the sealing member 70. For example, the material of the sealing member 70 is an alloy such as AuGe, AuSi, AuSn, SnPb, PbAg, SnAgCu or SnZnBi.

As a result of such a second through hole 58 and a sealing member 70, which blocks the second through hole 58, being provided, it is possible to configure the cavity 56 as an inert gas (for example, nitrogen gas) atmosphere through the second through hole 58. In addition, it is possible to adjust the degree of vacuum of the cavity 56 through the second through hole 58.

As shown in FIG. 2, the functional element 80, as the second base body, is supported by the outer surface 11 of the base body 10 (on the base body 10). The functional element 80 is accommodated in the cavity 56, which is surrounded by the base body 10 and the lid 50. Hereinafter, a case in which the functional element 80 is an acceleration sensor element that detects acceleration in a horizontal direction (the X axis direction) (an electrostatic capacitance type MEMS acceleration sensor element) will be described.

As shown in FIG. 1 and FIG. 2, the functional element 80, as the second base body, can include fixing sections 81 and 82, connecting sections 84 and 85, the movable section 86, the movable electrode sections 87, and the fixing sections 88 and 89.

The movable section 86 is displaced in the X axis direction (the +X axis direction or the −X axis direction) while causing the connecting sections 84 and 85 to become elastically deformed depending on a change in acceleration in the X axis direction. The sizes of the gaps between the movable electrode sections 87 and the fixing sections 88, and the gaps between the movable electrode sections 87 and the fixing sections 89 change in accordance with such displacement. That is, the sizes of the electrostatic capacitances between the movable electrode sections 87 and the fixing sections 88, and the electrostatic capacitances between the movable electrode sections 87 and the fixing sections 89 change in accordance with such displacement. The functional element 80 (the electronic device 100) can detect acceleration in the X axis direction on the basis of these changes in electrostatic capacitances.

The fixing sections 81 and 82 are bonded to the outer surface 11 of the base body 10. In the illustrated example, the fixing sections 81 and 82 are provided in a manner that straddles the outer peripheral edge of the recessed section 14 in plan view when viewed from the Z axis direction in the drawings.

The movable section 86 is provided between the fixing sections 81 and 82. In the example that is shown in FIG. 1, the planar form of the movable section 86 is an oblong shape having long edges along the X axis.

The connecting sections 84 and 85 connect the movable section 86 to the fixing sections 81 and 82. The connecting sections 84 and 85 have a predetermined spring constant, and are configured to be able to displace the movable section 86 in the X axis direction. In the example that is shown in FIG. 1, the connecting section 84 is configured by two beams 84a and 84b, which form a shape that extends in the X axis direction while meandering in the Y axis direction. In the same manner, the connecting section 85 is configured by two beams 85a and 85b, which form a shape that extends in the X axis direction while meandering in the Y axis direction.

The movable electrode sections 87 are connected to the movable section 86. A plurality of the movable electrode sections 87 are provided. The movable electrode sections 87 protrude in the +Y direction and the −Y direction from the movable section 86, and are aligned in the X axis direction in a manner that forms a comb tooth shape.

With respect to the fixing sections 88 and 89, one end portion thereof is bonded to the outer surface 11 of the base body 10, as a fixed end, and the other end portion thereof protrudes toward a movable section 86 side, as a free end. Pluralities of the fixing sections 88 and 89 are respectively provided. The fixing sections 88 are electrically connected to the wiring 22, and the fixing section 89 are electrically connected to the wiring 24. The fixing sections 88 and 89 are alternately aligned in the X axis direction in a manner that forms a comb tooth shape. The fixing sections 88 and 89 are provided facing the movable electrode sections 87 with an interval therebetween, the fixing sections 88 are disposed on one side (the −X direction side) of the movable electrode sections 87, and the fixing sections 89 are disposed on the other side (the +X direction side) thereof.

The fixing sections 81 and 82, the connecting sections 84 and 85, the movable section 86 and the movable electrode sections 87 are formed in an integral manner. For example, the material of the functional element 80 is a silicon, which has been given a conductive property as a result of being doped with impurities such as phosphorous and boron.

For example, in a case in which the material of the base body 10 is a glass that includes an alkali metal ion, and the material of the functional element 80 is silicon, it is possible to use an anodic bonding technique as the bonding method of the functional element 80 (the fixing sections 81 and 82 and the fixing sections 88 and 89) and the base body 10. In the present embodiment, the base body 10 and the functional element 80 are bonded using a first repetition of anodic bonding (a first bonding process that will be described later).

In the electronic device 100, it is possible to measure the electrostatic capacitances between the movable electrode sections 87 and the fixing sections 88 using the external connection terminals 30 and 32. In the electronic device 100, it is possible to measure the electrostatic capacitances between the movable electrode sections 87 and the fixing sections 89 using the external connection terminals 30 and 34. In this manner, in the electronic device 100 the electrostatic capacitances between the movable electrode sections 87 and the fixing sections 88, and the electrostatic capacitances between the movable electrode sections 87 and the fixing sections 89 are measured separately, and therefore, it is possible to detect a physical quantity (acceleration) with high accuracy on the basis of the measurement results.

Additionally, in the above-mentioned description, a case in which the functional element 80 is an acceleration sensor element, which detects acceleration in the X axis direction, is described, but the functional element 80 may be an acceleration sensor element, which detects acceleration in the Y axis direction, or may be an acceleration sensor element, which detects acceleration in the vertical direction (the Z axis direction). In addition, a plurality of such functional elements 80 may be mounted in the electronic device 100. In addition, the functional element 80 is not limited to an acceleration sensor element, and for example, may be a gyro sensor element, a pressure sensor element, or the like that detects angular velocity.

According to the electronic device 100, the rough surfaces 74 and 76, as the second surfaces having more pronounced rough surface states than the bonding surface 72, as the first surface including the bonding surface of the base body 10 as the first base body and the lid 50 as the third base body, are provided in a peripheral region of the bonding surface 72. In other words, in the bonding surface 72, which includes the bonding portion of the base body 10 and the lid 50, surface roughness (the size of uneven portions) is less than that of the peripheral region thereof, and therefore, the bonding surface 72 has a surface in which flatness is maintained (for example, a polished surface or a mirror finish surface). Accordingly, as a result of the fact that it is possible to enhance the adhesive properties of the base body 10 and the lid 50, for example, it is possible to stabilize the bonding of the base body 10 and the lid 50 using anodic bonding, and therefore, it is possible to increase the bonding strength.

2. Manufacturing Method of Electronic Device

Next, the manufacturing method of the electronic device 100 according to the present embodiment will be described with reference to FIG. 4, FIG. 5A to FIG. 5F and FIG. 6. Additionally, the cross-sectional positions in each drawing of FIG. 5A to 5F are the same as those of FIG. 2. In addition, the configuration of the electronic device 100 will be described with combined reference to FIG. 1, FIG. 2, FIG. 3A and FIG. 3B. Additionally, in the same manner as above, description will be given using an example that adopts an acceleration sensor as the electronic device 100.

As shown in FIG. 4, a manufacturing method of an acceleration sensor includes a first base body preparation process (Step S101) that prepares the base body 10 as the first base body, as a preparation process, a silicon substrate preparation process (Step S102) that prepares a silicon substrate 8, which is an element sheet that forms the functional element 80 as the second base body, and a third base body preparation process (Step S103) that prepares the lid 50 as the third base body. In addition, the manufacturing method of an acceleration sensor includes a protective layer formation process (Step S104) that forms the protective layer 60 on the base body 10, a first bonding process (Step S106) that includes a first repetition of anodic bonding, a first etching process (Step S108) that forms a functional element, a second etching process (Step S110) that removes the protective layer, and a second bonding process (Step S112) that includes a second repetition of anodic bonding. Furthermore, the manufacturing method of an acceleration sensor may also include a sealing process (Step S114) that blocks a hole portion for air inflow and outflow, which is provided in the lid 50. In addition, the manufacturing method of an acceleration sensor may also include a process (not illustrated in the drawings) that blocks the first through hole 57, which is provided in the lid 50, in order to perform blocking between the groove sections 15, 16 and 17 that are provided in the base body 10, and the lid 50, using the filling member 90.

First Base Body Preparation Process (Step S101)

Firstly, a base body 10 such as that illustrated in FIG. 5A is prepared as the first base body. In the first base body preparation process (Step S101), the recessed section 14 and the groove sections 15, 16 and 17 are formed on the outer surface 11 (one surface) of the base body 10 (refer to FIG. 1). For example, the recessed section 14 and groove sections 15, 16 and 17 are formed using a photolithography technique and an etching technique. As a result of this, it is possible to prepare a base body 10 in which the recessed section 14 and groove sections 15, 16 and 17 are provided on the outer surface 11. For example, the base body 10 includes an alkali metal ion, and for example, is made from a borosilicate glass.

Further, the wiring 20, 22 and 24 are respectively formed inside the groove sections 15, 16 and 17. Next, the external connection terminal 30 and the contact section 40 are formed on the wiring 20 (on the outer surface 11 side of the base body 10) so as to be electrically connected to the wiring 20. In the same manner, the external connection terminal 32 and the contact section 42 are formed on the wiring 22 so as to be electrically connected to the wiring 22 (refer to FIG. 1). In addition, the external connection terminal 34 and the contact section 44 are formed on the wiring 24 so as to be electrically connected to the wiring 24 (refer to FIG. 1).

For example, the wiring 20, 22 and 24 are formed by patterning a conductive layer (not illustrated in the drawings) after forming the conductive layer as a film using a sputtering technique, a Chemical Vapor Deposition (CVD) technique, or the like. The patterning is performed using a photolithography technique and an etching technique. It is also possible to perform the patterning using a lift-off technique that forms wiring by forming a conductive film as a film after patterning using a photoresist, and simultaneously peeling away unnecessary film at the same time as the photoresist. For example, the external connection terminals 30, 32 and 34 and the contact sections 40, 42 and 44 are formed using the same method as the wiring 20, 22 and 24.

As a result of the above-mentioned processes, it is possible to prepare a base body 10 in which the recessed section 14, the wiring 20, 22 and 24, the external connection terminals 30, 32 and 34, the contact sections 40, 42 and 44, and the like, are provided.

Silicon Substrate Preparation Process (Step S102)

In a similar manner, a silicon substrate 8 such as that shown in FIG. 5B is prepared as an original substrate, which forms the functional element 80 as the second base body. In the silicon substrate preparation process (Step S102), relief recessed sections 9, as relief sections of the protective layer 60 that will be described later, are patterned and formed on the side of the silicon substrate 8 that is mounted on the base body 10. The patterning of the relief recessed sections 9 is performed using a photolithography technique and an etching technique.

As shown in FIG. 7, the relief recessed sections 9 are formed in a circuit form facing the protective layers 60, which are installed on the base body 10, with a width dimension W3$a$ in which the protective layers 60 having the width dimension W2$a$, correspond to the inner sides thereof in plan view. In other words, it is preferable that the width dimension W3$a$ of the relief recessed sections 9 is configured to be larger than the width dimension W2$a$ of the protective layers 60 (W2$a$<W3$a$). In addition, it is sufficient as long as the depth d of the relief recessed sections 9 is a thickness h of the protective layers 60, which are installed on the base body 10, or more (d>h). As a result of such a configuration, it is possible to reliably bond the silicon substrate 8 to the base body 10 without obstructing the protective layers 60.

Third Base Body (Lid) Preparation Process (Step S103)

In a similar manner, a lid 50 such as that illustrated in FIG. 5E is prepared as the third base body. For example, it is possible to use silicon, glass, or the like as the material of the third base body (the lid). In the third base body (the lid) preparation process (Step S103), the recessed section 56$a$, which forms the cavity 56 between the base body 10 and itself, and the second through hole 58, which penetrates through the lid 50 from the outer surface to a recessed section 56$a$ side, are formed. It is possible to adopt a photolithography technique and an etching technique in the formation of the recessed section 56$a$ and the second through hole 58.

Protective Layer Formation Process (Step S104)

Next, in the protective layer formation process (Step S104), which forms the protective layers 60, as shown in FIG. 5A, the protective layers 60 are formed on regions of the outer surface 11 of the base body 10 to which the lid 50 is to be bonded in the second bonding process (Step S112), which will be described later. The protective layers 60 can be formed using the above-mentioned method that uses a photolithography technique and an etching technique, using a lift-off technique, or the like. It is preferable that the protective layers 60 are formed using diamond-like carbon (DLC) films. Diamond-like carbon (DLC) films are generally used in processing, or the like, of semiconductor substrate, and it is possible to form the protective layers 60 without performing a dedicated process. In a case in which diamond-like carbon (DLC) films are used in the protective layers 60, it is suitable to perform formation using a lift-off technique. More specifically, as shown in FIG. 6, patterned resist films 65 are provided on the base body 10. Further, when the diamond-like carbon (DLC) films are formed on the base body 10, which includes the resist films 65, the DLC films are formed on the resist films 65 and on the outer surface 11 of the base body 10, which is exposed. Thereafter, when the resist films 65 are removed as a result of peeling away, or the like, the removal also includes DLC films 61 on the resist films 65, the DLC films on the base body 10 remain, and therefore, it is possible to form patterned protective layers 60. Additionally, the DLC films are hard, the adhesive properties thereof with respect to the base material are favorable, and the DLC films are resistant to dry etching gases, and the like that are used in the first etching process S108, which will be described later. Further, for example, it is even possible to easily perform the removal using oxygen plasma, or the like.

As shown in FIG. 7, the protective layers 60 are formed in a shape, which includes a region that faces the fourth surfaces 52 of the lid 50, which are to be bonded to the base body 10. Accordingly, the protective layers 60 are formed on the outer surface 11 of the base body 10 in a circuit form. It is preferable that the width dimensions W2a to W2d of the protective layers 60 are configured to be the width dimensions W1a to W1d (W1a≤W2a, W1b≤W2b, W1c≤W2c, and W1d≤W2d) of the fourth surfaces 52 of the lid 50, or more. In other words, in plan view, the protective layers 60 may be configured to have the same width dimensions as the fourth surfaces 52, which are the bonding surfaces 72 of the lid 50 (W1a=W2a, W1b=W2b, W1c=W2c, W1d=W2d), or may be configured to have width dimensions that include the fourth surfaces 52, which are the bonding surfaces of the lid 50, on the inner sides thereof (W1a<W2a, W1b<W2b, W1c<W2c, W1d<W2d). Additionally, the protective layers 60 may have shapes that includes at least a portion of a region that faces the fourth surfaces 52 of the lid 50 to be bonded to the base body 10, and therefore, it is possible to enhance the bonding strength of the base body 10 and the lid 50.

Additionally, it is preferable that the width dimensions W2 of the protective layers 60 are configured to be wider than the width dimensions W1 of the fourth surfaces 52 of the lid 50 (W1<W2). If such a configuration is used, even if there is variation in the disposition position of the lid 50 in the second bonding process (Step S112), which will be described later, since it is possible to bond the lid 50 to the inside of the bonding surfaces 72, which are configured by regions from which the protective layers 60 were removed, that is, since it is possible to bond the lid 50 to the inside of the bonding surface 72 having high flatness, it is possible to further improve bonding stability.

First Bonding Process (Step S106)

Next, in the first bonding process (Step S106), as shown in FIG. 5B, the silicon substrate 8, which is prepared in the silicon substrate preparation process (Step S102) mentioned earlier, is bonded to the base body 10. The silicon substrate 8 is mounted on the base body 10 by positioning the protective layers 60, which are provided on the base body 10, on the inner sides of the relief recessed sections 9, as the relief groove sections, and bonding is performed using anodic bonding (a first repetition of anodic bonding). As conditions of the first repetition of anodic bonding, for example, it is preferable that a DC voltage of approximately 800 V to 1 kV is applied while performing heating to approximately 300° C. Additionally, the heating temperature in the anodic bonding can adopt a range from approximately 250° C. to 500° C. Additionally, the relief recessed sections 9, as the relief groove sections, may be bottomed members, or may be holes that penetrate through. That is, it is sufficient as long as the depth d of the relief recessed sections 9 is a thickness h of the protective layers 60, which are installed on the base body 10, or more (d>h). Further, in the anodic bonding, regions other than portions in which the base body 10 and the silicon substrate 8 come into contact with one another, that is, portions in which the relief recessed sections 9 of the silicon substrate 8 and the recessed section 14 of the base body 10 are provided, are bonded.

First Etching Process (Step S108)

Next, in the first etching process (Step S108), as shown in FIG. 5C, the functional element 80 (refer to FIG. 1 and FIG. 2) is formed by patterning on the silicon substrate 8, which is anodically bonded to the base body 10 in the first bonding process (S106) mentioned earlier. It is possible to perform the patterning using a photolithography technique and an etching technique. Additionally, the silicon substrate may be thinned to a predetermined thickness before the patterning.

In the first etching process (Step S108), it is possible to use dry etching or wet etching. A dry etching technique that uses an Inductively Coupled Plasma (ICP) technique is suitably used. For example, in a case in which sulfur hexafluoride (SF6) is used as a principal etching gas, when an SF6 etching rate of the silicon substrate 8 is set to R8, and an SF6 etching rate of the base body 10 is set to R10, the SF6 etching rate R8 of the silicon substrate 8 is 10 times or more faster than the SF6 etching rate R10 of the base body 10. In addition, the SF6 etching rate R10 of the base body 10 is faster than an SF6 etching rate R60 of the protective layers 60, which are formed using diamond-like carbon (DLC) films. That is, a relationship of R8>R10>R60 is established for the SF6 etching rates of each member.

In this manner, in the first etching that performs a process on the silicon substrate 8, which is bonded to the base body 10, in the first etching process (Step S108), since the etching rate of the silicon substrate 8 is faster than those of the base body 10 and the protective layers 60, it is possible to suppress damage to the base body 10 and the protective layers 60 due to the first etching. In addition, since the etching rate of the protective layers 60 is slower than that of the base body 10, in the first etching, corrosion of the outer surface does not occur in regions of the base body 10 in which the protective layers 60 are provided, and therefore, it is possible to preserve an initial outer surface state thereof. However, some corrosion of the outer surfaces occurs in the first etching in regions of the base body 10 in which the protective layers 60 are not provided and the functional element 80 is not provided. In other words, the rough surfaces 74 having width dimensions R1a and R1b, and the rough surface 76 having a width dimension R2a, which have coarse surface states or rough surface states caused by some corrosion of the outer surface, are formed on both sides of the protective layers 60. Additionally, the above-mentioned coarse surface state or rough surface state can refer to a surface state in a state in which variations in surface height due to uneven portions of a surface, are large, and so-called surface roughness is large (coarse), and can be visually recognized as a so-called pearskin finish state, or a white turbid state (a so-called cloudy glass state) which is not a mirror surface.

Second Etching Process (Step S110)

Next, in the second etching process (Step S110), as shown in FIG. 5D, the protective layers 60, which are provided on the outer surface 11 of the base body 10 and are formed using diamond-like carbon (DLC) films, are removed using a second etching. The outer surface 11 of the base body 10 from which the protective layers 60 are removed, corresponds to bonding regions 78 in which the original outer surface state (an outer surface states having little surface roughness) of the base body 10 is retained. Additionally, for example, the second etching can adopt a dry etching technique that uses oxygen plasma, or the like.

In the second etching, the etching rate of the protective layers 60, which are formed using DLC films, is faster than those of the base body 10 and the functional element 80 (the silicon substrate 8). In addition, in the second etching, since the etching rate of the protective layers 60 is faster than those of the base body 10 and the functional element 80 (the silicon substrate 8), it is possible to remove the protective layers 60 in a centralized manner.

Second Bonding Process (Step S112)

Next, in the second bonding process (Step S112), as shown in FIG. 5E, the lid 50, which is prepared in the third base body (the lid) preparation process (Step S103) mentioned earlier, is bonded to the base body 10. After the lid 50 is mounted in a manner in which the functional element 80, which is formed in the first etching process (Step S108) mentioned earlier, is accommodated inside the cavity 56, and in which among the outer surface 11 of the base body 10, the fourth surfaces 52 (refer to FIG. 2) abut against the bonding regions 78 from which the protective layers 60 were removed, bonding to the base body 10 is performed using anodic bonding (a second repetition of anodic bonding).

In this manner, on the outer surface 11 of the base body 10, the lid 50 is bonded to the bonding regions 78 from which the protective layers 60 were removed. In the bonding regions 78, since corrosion does not occur in the second etching process (Step S110), and the flat (having high flatness) outer surface state of the outer surface 11 of the base body 10 is preserved, the contact area of the base body 10 and the lid 50 is increased, the stability of bonding is improved, and therefore, it is also possible to increase the bonding strength.

In addition, the bonding regions 78 are regions in which the protective layers 60 were provided, and since the relief recessed sections 9 of the protective layers 60 are provided on the silicon substrate 8 in the anodic bonding (the first repetition) in the first bonding process (Step S106), a DC voltage is not applied thereto. Accordingly, a depleted layer, in which alkali metal ions that are present in the base body 10, move to bonding portions with the silicon substrate 8 as a result of a DC voltage being applied, and alkali metal ions attain a depleted state, does not arise. In this manner, since a sufficient amount of alkali metal ions, which are required in anodic bonding, are present, it is possible to enhance the bonding strength of the base body 10 and the lid 50, which is the second repetition of anodic bonding, and it is possible to perform bonding stably. As conditions of the second repetition of anodic bonding, for example, it is possible TO apply a DC voltage of approximately 800 V to 1 kV while performing heating to approximately 400° C.

Additionally, in contrast to the above, in anodic bonding (the second repetition of anodic bonding) in a case in which a depleted layer of alkali metal ions remains, there are cases in which it is not possible to obtain a sufficient bonding strength. Various defects can occur in cases in which the conditions such as the heating conditions and the application voltage are increased in order to obtain a sufficient bonding strength. For example, when the heating temperature is increased, there is a concern that bonding stress resulting from differences in thermal expansion coefficients of the base body 10 and the lid 50, will be increased, and therefore, that deterioration of the bonding state, that is, a reduction in the bonding strength will occur.

Sealing Process (Step S114)

Firstly, although not illustrated in the drawings, the filling member 90 (refer to FIG. 2) is formed inside the first through hole 57 (refer to FIG. 2) and the groove section 15 (refer to FIG. 2) so as to be embedded in the groove section 15. More specifically, the filling member 90 is embedded inside the groove section 15 from the first through hole 57 (passing through the first through hole 57). The filling member 90 is also formed inside the groove sections 16 and 17, and can be embedded in the groove sections 16 and 17. For example, an insulation film such as a silicon oxide film (more specifically, a Tetra Ethyl Ortho Silicate (TEOS) film), or a silicon nitride (SiN) film is used, and the filling member 90 is form as a film using a CVD technique, or the like. At this time, it is preferable to use a mask having a through hole in a portion that corresponds to the first through hole 57, which was prepared beforehand. For example, the mask can use a metal mask, a silicon mask, or the like.

Next, in the sealing process (Step S114), as shown in FIG. 5F, the cavity 56 is sealed by blocking the second through hole 58 (refer to FIG. 5E) with the sealing member 70, but prior to this, the atmosphere of the cavity 56 is adjusted using the second through hole 58. For example, the cavity 56 may be configured to be an inert gas (nitrogen gas) atmosphere, or may be configured to have a reduced pressure state through the second through hole 58.

Further, as shown in FIG. 5F, the second through hole 58 is blocked by forming the sealing member 70 inside the second through hole 58. More specifically, the sealing member 70 is formed by disposing solder balls (not illustrated in the drawings) inside the second through hole 58, and melting the solder balls as a result of radiation with laser light L. It is possible to seal the cavity 56 using the sealing member 70.

Additionally, as a result of forming the sealing member 70 in a state in which the pressure is reduced, it is possible to omit a process that sets the cavity 56 to a reduced pressure state through the second through hole 58. That is, the second through hole 58 need not necessarily be provided. As a result of this, it is possible to simplify the process. For example, in a case in which the functional element 80 is a gyro sensor element, it is desirable that the cavity 56 is in a reduced pressure state. As a result of this, it is possible to suppress a circumstance in which a vibration phenomenon of the gyro sensor element is dampened as a result of air viscosity.

It is possible to manufacture the electronic device 100 using the above-mentioned processes.

According to the above-mentioned manufacturing method of the electronic device 100, even if the first etching process is performed on the silicon substrate 8, which is bonded (a first repetition) to the base body 10 using the protective layers 60, which are provided on the base body 10, as the first base body, to which the lid 50, as the third base body, is bonded, it is possible to suppress a circumstance of a surface having a rough surface state in which the outer surface 11 of the base body 10, to which the lid 50 is bonded, becomes roughened, and flatness is impaired as a result. Further, it is possible to perform bonding of the base body 10 and the lid 50 with a sufficient bonding strength by bonding the lid 50 to the bonding regions 78 (a surface in which flatness is not impaired) of the outer surface 11 of the base body 10 from which the protective layers 60 were removed. In other words, it is possible to suppress a circumstance in which the bonding strength of the base body 10 and the lid 50 is reduced, the bonding state is unstable, or the like, due to the flatness of the base body 10 being impaired.

Additionally, in the first etching that performs a process on the silicon substrate 8 (the functional element 80 as the second base body), which is bonded to the base body 10, since the etching rate of the silicon substrate 8 (the functional element 80 as the second base body) is faster than those of the base body 10 and the protective layers 60, it is possible to suppress damage to the base body 10 and the protective layers 60. In addition, in the second etching, which removes the protective layers 60, since the etching rate of the protective layers 60 is faster than those of the base body 10 and the silicon substrate 8 (the functional element 80 as the second base body), it is possible to remove the protective layers 60 in a centralized manner.

In addition, by forming the protective layers 60 in circuit form, it is also possible to configure an unroughened surface of the outer surface 11 of the base body 10 in circuit form. Accordingly, since it is also possible to perform bonding of the base body 10 and the lid 50 in circuit form, it is possible to stably perform bonding of an outer periphery in which the functional element 80 is set as an inner side.

In addition, diamond-like carbon (DLC) films, which are used as the protective layers 60, are generally used in processing, or the like, of silicon substrates, and it is possible to form the protective layers 60 without performing a dedicated process. Additionally, DLC films are hard, the adhesive properties thereof with respect to the silicon substrate 8 and the base body 10 are favorable, and DLC films are resistant to dry etching gases. Further, for example, it is even possible to easily perform the removal using oxygen plasma, or the like.

In addition, since it is possible to avoid the protective layers 60 using the relief recessed sections 9 as relief groove sections, it is possible to bond the silicon substrate 8 to the base body 10 in a manner in which the protective layers 60 are still provided. As a result of this, it is possible to perform bonding in a state in which a plurality of silicon substrates 8 are connected.

In addition, the bonding strength is increased as a result of the silicon substrate 8 (the functional element 80 as the second base body) being anodically bonded (the first repetition) to the base body 10, and therefore, it is possible to perform stable bonding. As a result of this, it is possible to perform etching, or the like, on the silicon substrate 8.

In addition, the bonding strength is increased as a result of the lid 50 being anodically bonded (the second repetition) to the base body 10, and therefore, it is possible to perform stable bonding. As a result of this, it is possible to reliably perform hermetic sealing using the lid 50.

Additionally, in the above-mentioned embodiment, description is given using a method that uses two repetitions of anodic bonding of the first bonding process (Step S106) and the second bonding process (Step S112), but the manufacturing method of an electronic device can be applied to manufacturing methods that perform a plurality of repetitions of anodic bonding, and therefore, can also be applied to cases in which a number of repetitions of anodic bonding that exceeds two (three repetitions or more) is performed.

In addition, the above-mentioned description is given using a method that uses anodic bonding in a first bonding process and a second bonding process, but the invention can also be applied to a case in which another bonding method that does not use an adhesive substance, is used. More specifically, the invention can also be applied to a direct bonding technique in which a flat and clean bonding surface is required such as low temperature plasma activated bonding.

Modification Example 1

Figure 8A:
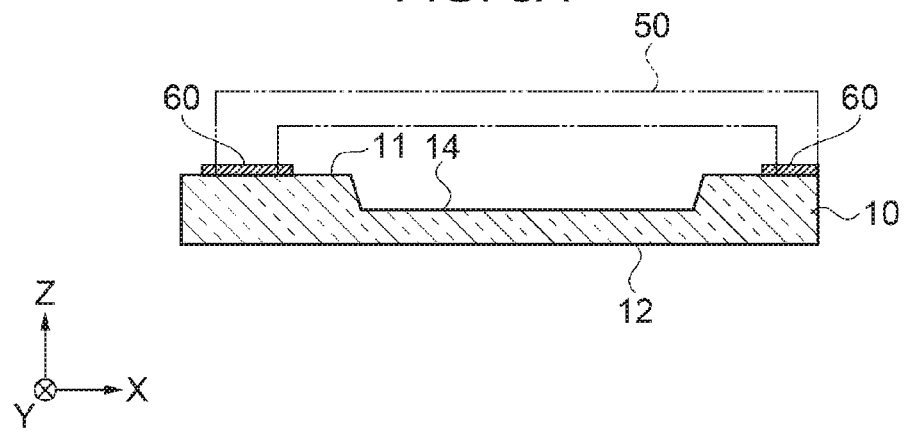
FIG. 8A is a process flow-1 (a front cross-sectional view) that shows an outline of a manufacturing method of an electronic device according to Modification Example 1.
Figure 8B:
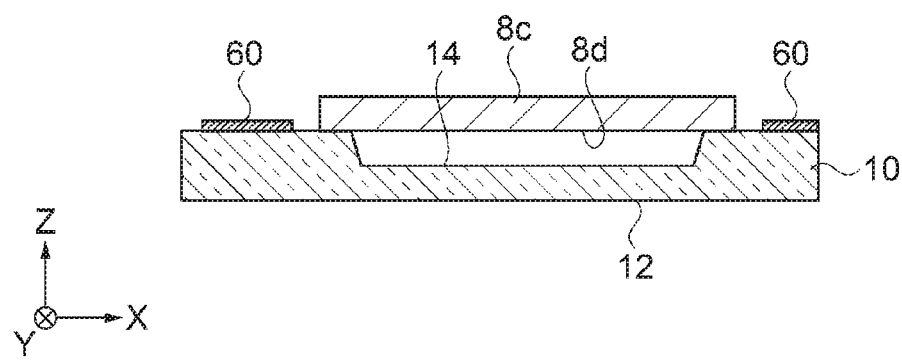
FIG. 8B is a process flow-2 (a front cross-sectional view) that shows the manufacturing method according to Modification Example 1.
Figure 8C:
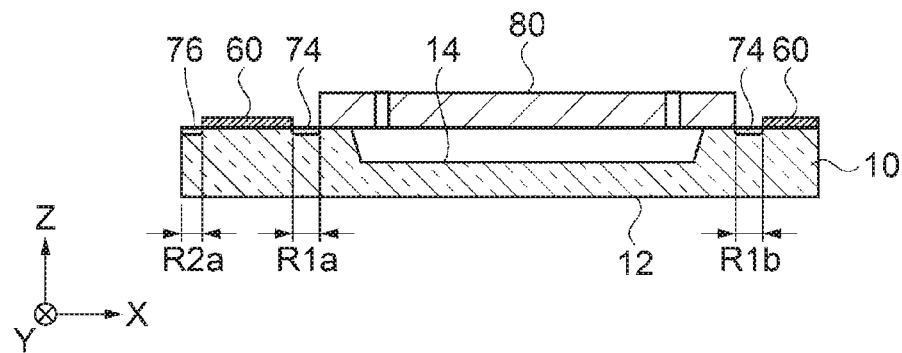
FIG. 8C is a process flow-3 (a front cross-sectional view) that shows the manufacturing method according to Modification Example 1.

Next, Modification Example 1 of the manufacturing method of an electronic device will be described with reference to FIG. 8A, FIG. 8B and FIG. 8C. FIG. 8A is a process flow-1 (a front cross-sectional view) that shows an outline of a manufacturing method of an electronic device according to Modification Example 1. FIG. 8B is a process flow-2 (a front cross-sectional view) that shows the manufacturing method according to Modification Example 1. FIG. 8C is a process flow-3 (a front cross-sectional view) that shows the manufacturing method according to Modification Example 1.

In the manufacturing method of an electronic device according to Modification Example 1, the configuration of the silicon substrate 8, which is the functional element 80 as the third base body, differs from that of the manufacturing method of the electronic device 100 according to the above-mentioned embodiment. The description of the present Modification Example 1 will be given focusing on manufacturing methods (configurations) that differ from the manufacturing method of the electronic device 100 according to the embodiment, and there are cases in which similar methods (configurations) are omitted.

The manufacturing method of an electronic device according to Modification Example 1 includes a process that prepares the base body 10 as the first base body, as a preparation process, a process that prepares a silicon substrate 8c, which is an element sheet that forms the functional element 80 as the third base body, and a process that prepares the lid 50 as the third base body. In this instance, since the process that prepares the base body 10 and the process that prepares the lid 50 are the same as those of the above-mentioned embodiment, description thereof will be omitted, and the process that prepares the silicon substrate 8c, which differs from the above-mentioned embodiment, will be described.

In the process that prepares the silicon substrate 8c, the silicon substrate 8c (refer to FIG. 8B) is formed by patterning singly (independently) following the external form of the functional element 80 as the third base body. The patterning of the silicon substrate 8c is performed using a photolithography technique and an etching technique.

Next, as shown in FIG. 8A, the protective layers 60 are formed in a region of the outer surface 11 of the base body 10 to which the lid 50 is to be bonded. The protective layers 60 are formed in a circuit form that surrounds an opening of the recessed section 14 having a predetermined gap therebetween. It is preferable that the protective layers 60 are formed using diamond-like carbon (DLC) films. Additionally, since the configuration of the protective layers 60 is similar to that of the above-mentioned embodiment, detailed description thereof will be omitted.

Next, as shown in FIG. 8B, the silicon substrate 8c, which was prepared in the process that prepares the silicon substrate 8c, is bonded to the base body 10. The silicon substrate 8c is mounted on the inner side of the protective layers 60, which are provided on the base body 10, in a manner that straddles the recessed section 14, which is formed on the base body 10, and bonding is performed using anodic bonding (a first repetition of anodic bonding). Additionally, a predetermined gap is included between the inner periphery of the protective layers 60 and the outer periphery of the silicon substrate 8c. Since the conditions of the first repetition of anodic bonding are similar to those of the above-mentioned embodiment, detailed description thereof will be omitted. In the anodic bonding, the silicon substrate 8c us bonded to the base body 10 as a result of a DC voltage for anodic bonding being applied to regions in which the outer surface 11 of the base body 10 (refer to FIG. 8A) and the silicon substrate 8c come into contact with one another. Further, the DC voltage for anodic bonding is not applied to regions in which the base body 10 and the silicon substrate 8c do not come into contact with one another.

Next, as shown in FIG. 8C, the thickness of the silicon substrate 8c, which is anodically bonded to the base body 10, is thinned, and the functional element 80 (refer to FIG. 1 and FIG. 2) is formed by performing patterning thereafter. It is possible to perform the patterning using a photolithography technique and an etching technique. In the patterning of the silicon substrate 8c, which is bonded to the base body 10, since the etching rate of the protective layers 60 is slower than that of the base body 10, in the etching, corrosion of the outer surface does not occur in regions of the base body 10 in which the protective layers 60 are provided, and therefore, it is possible to preserve an initial outer surface state thereof. However, some corrosion of the outer surfaces occurs in the etching in regions of the base body 10 in which the protective layers 60 are not provided and the functional element 80 is not provided. In other words, the rough surfaces 74 having width dimensions R1a and R1b, and the rough surface 76 having a width dimension R2a, which have coarse surface states or rough surface states caused by some corrosion of the outer surface, are formed on both sides of the protective layers 60. Additionally, the above-mentioned coarse surface state or rough surface state can refer to a surface state in a state in which variations in surface height due to uneven portions of a surface, are large, and so-called surface roughness is large (coarse), and can be visually recognized as a so-called pearskin finish state, or a white turbid state (a so-called cloudy glass state) which is not a mirror surface.

From this point onwards, the method continues with the process that removes the protective layers 60 using etching, the process that bonds the lid 50 to the base body 10, and the sealing process that seals the cavity 56 (refer to FIG. 2) by blocking the second through hole 58 (refer to FIG. 2), which is provided in the lid 50, but since these processes are similar to those of the above-mentioned embodiment, description thereof will be omitted.

In a method that forms the silicon substrate 8c by patterning singly (independently) following the external form of the functional element 80 as the third base body, and bonds the silicon substrate 8c to the base body 10 thereafter in the manner of the manufacturing method of an electronic device in the present Modification Example 1, it is also possible to exhibit similar effects to those of the manufacturing method in the above-mentioned embodiment. For example, it is possible to suppress a circumstance in which the bonding strength of the base body 10 and the lid 50 is reduced, the bonding state is unstable, or the like, due to the flatness of the base body 10 being impaired.

Modification Example 2

Figure 9:
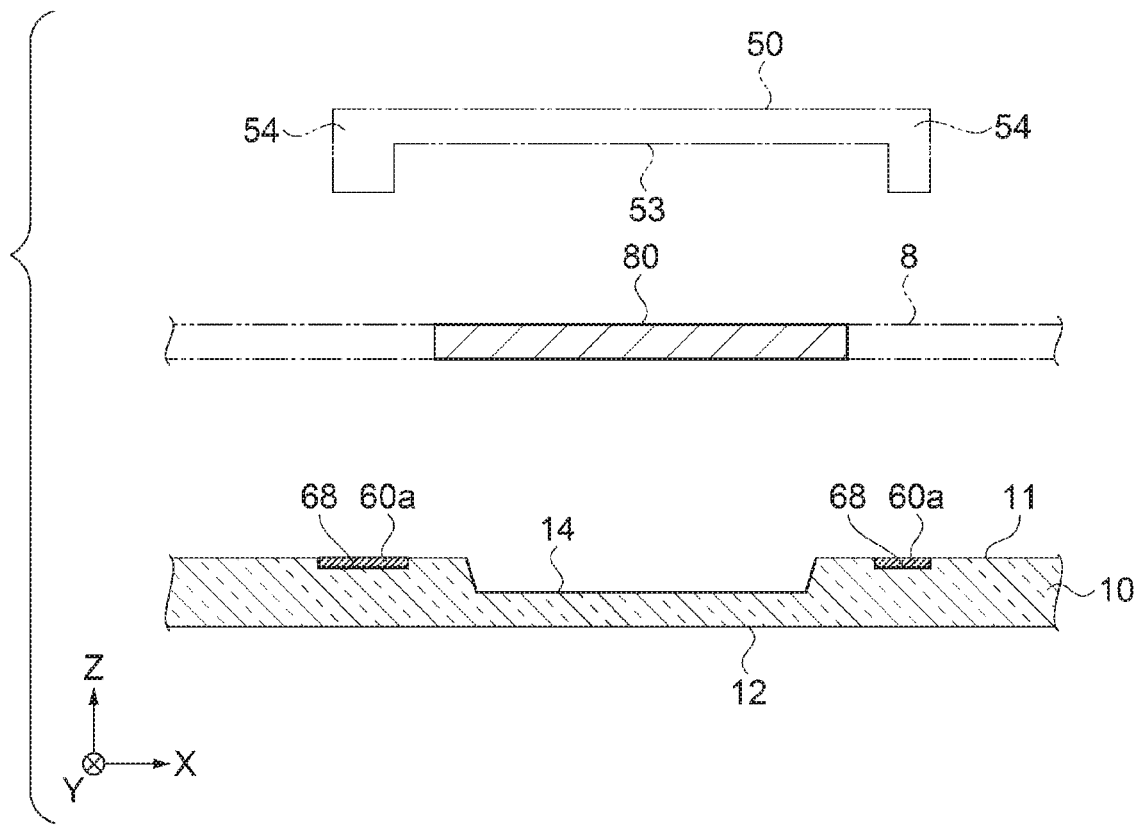
FIG. 9 is a front cross-sectional view that schematically shows a bonding portion of a base body and a lid of an electronic device according to Modification Example 2.

Next, Modification Example 2 of a manufacturing method of an electronic device will be described with reference to FIG. 9. FIG. 9 is a front cross-sectional view that schematically shows a bonding portion of a base body and a lid of an electronic device according to Modification Example 2. In the manufacturing method of an electronic device according to the present Modification Example 2, the method of formation of protective layers 60a, which are provided on the outer surface 11 of the base body 10, differs from that of the above-mentioned embodiment. The description of other processes will be omitted since they are similar to those of the above-mentioned embodiment, and in this instance, the method of formation of protective layers 60a will be described.

As shown in FIG. 9, the protective layers 60a according to Modification Example 2 are install inside bottomed recessed sections 68, which is engraved into the outer surface 11 of the base body 10. The recessed sections 68 are formed in a shape, which includes a region that faces the bonding portions of the lid 50, which are to be bonded to the base body 10. Accordingly, the recessed sections 68 are formed on the outer surface 11 of the base body 10 in a circuit form. As a result of this, the protective layers 60a are formed in a shape, which includes a region that faces the bonding portions of the lid 50, which are to be bonded to the base body 10. In the same manner as the above-mentioned embodiment, it is preferable that the protective layers 60a are formed using diamond-like carbon (DLC) films.

Additionally, the protective layers 60a are removed in a later process in the same manner as the above-mentioned embodiment, and the lid 50 is bonded to the inside of the bottom portions of the recessed sections 68, which are exposed.

In this kind of configuration of the protective layers 60a of Modification Example 2, corrosion of the base body 10 due to an etching liquid that forms the functional element 80, does not occur, and therefore, it is also possible to suppress a circumstance in which surface roughness in a region that is bonded to the lid 50 becomes rough.

Electronic Apparatus

Figure 10:
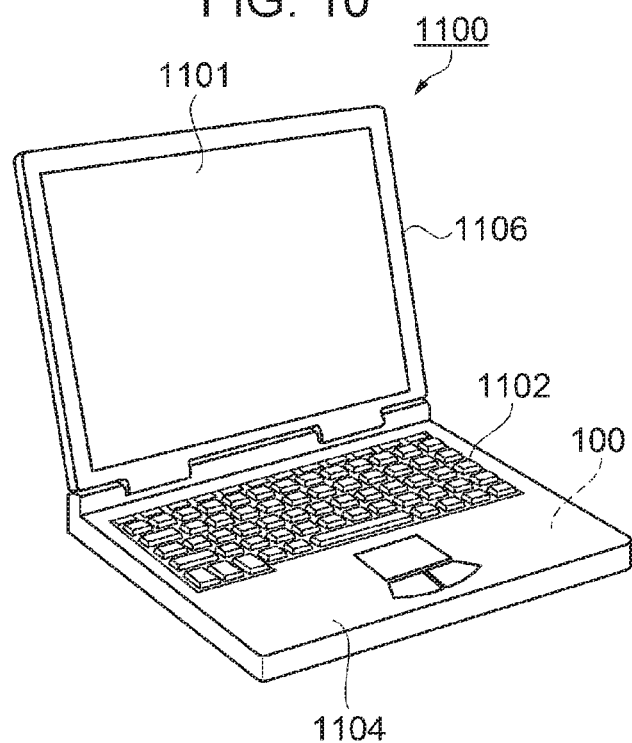
FIG. 10 is a perspective view that schematically shows a configuration of a mobile type (or note type) personal computer as an electronic apparatus that is provided with an electronic device.

Next, an electronic apparatus that is provided with the above-mentioned electronic device 100 will be described. FIG. 10 is a perspective view that schematically shows a configuration of a mobile type (or note type) personal computer as an electronic apparatus that is provided with the electronic device 100.

As shown in FIG. 10, a personal computer 1100 is configured by a main body section 1104, which is provided with a keyboard 1102, and a display unit 1106 having a display section 1101, and the display unit 1106 is supported by the main body section 1104 in a movable manner through a hinge structure section. The electronic device 100 (an acceleration sensor) is built into this kind of personal computer 1100.

Figure 11:
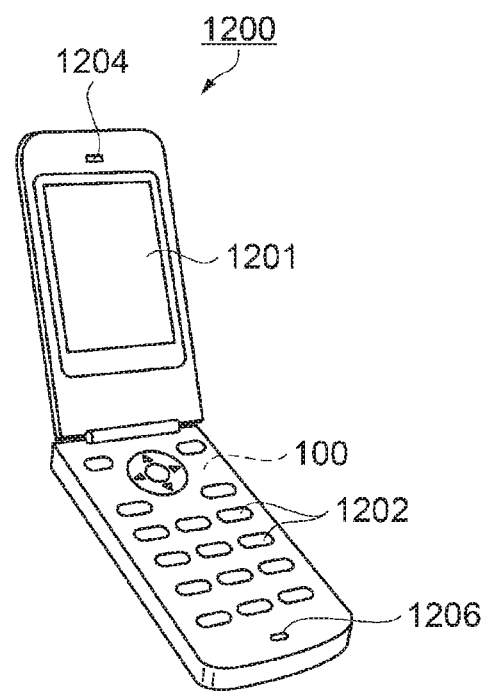
FIG. 11 is a perspective view that schematically shows a configuration of a mobile phone (including a PHS) as an electronic apparatus that is provided with an electronic device.

FIG. 11 is a perspective view that schematically shows a configuration of a mobile phone (including a PHS) as an electronic apparatus that is provided with the electronic device 100. As shown in FIG. 11, a mobile phone 1200 is provided with a plurality of operation button 1202, an ear piece 1204 and a mouth piece 1206, and a display section 1201 is disposed between the operation buttons 1202 and the ear piece 1204. The electronic device 100 (an acceleration sensor) is built into this kind of mobile phone 1200.

Figure 12:
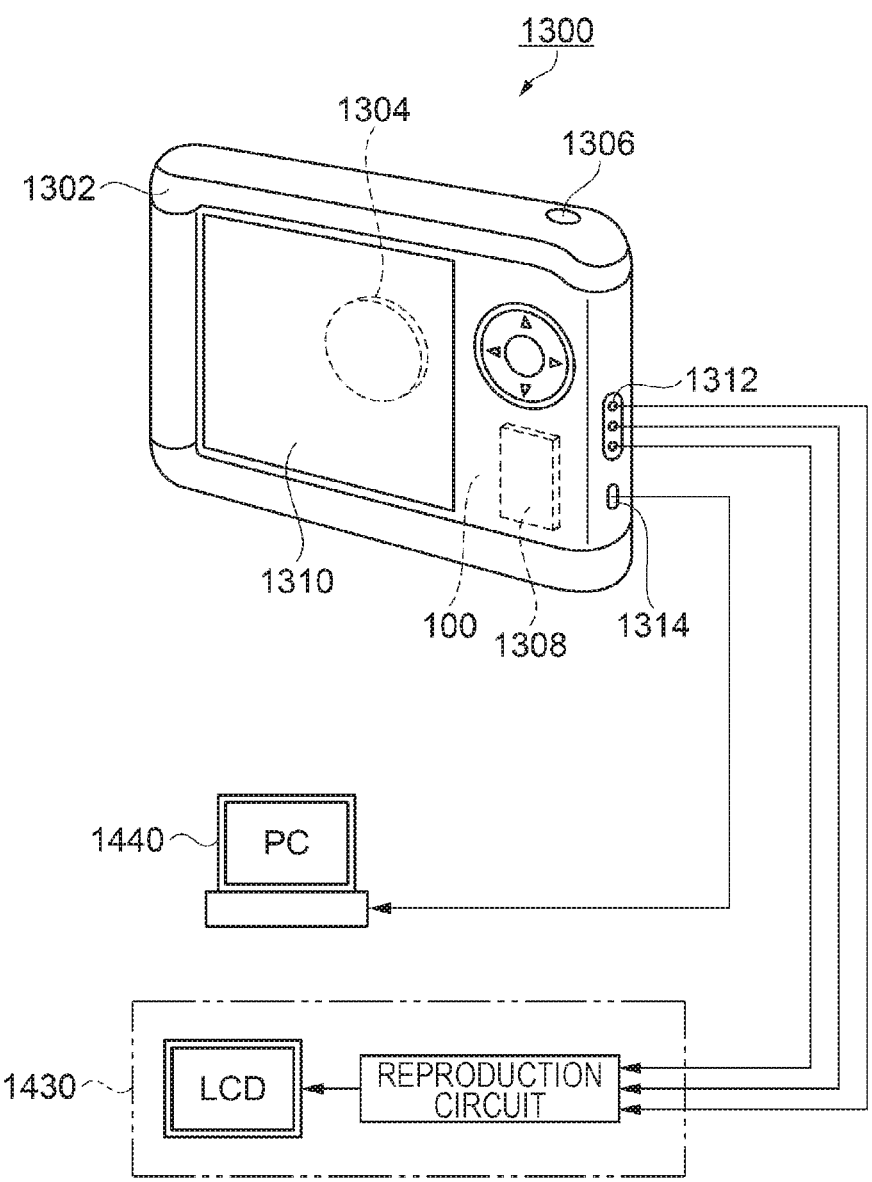
FIG. 12 is a perspective view that schematically shows a configuration of a digital still camera as an electronic apparatus that is provided with an electronic device.

FIG. 12 is a perspective view that schematically shows a configuration of a digital still camera as an electronic apparatus that is provided with the electronic device 100. Additionally, in FIG. 12, a connection to external equipment is also shown in a simplified manner. In this instance, whereas a normal camera exposes a silver salt photographic film using an optical image of a subject, a digital still camera 1300 creates an image capturing signal (an image signal) by performing photoelectric conversion of the optical image of the subject using an image sensor such as a Charge Coupled Device (CCD).

A display section 1310 is provided on a back surface (the front side in the drawing) of a case (a body) 1302 of the digital still camera 1300, is configured to perform display on the basis of an image capturing signal from the CCD, and the display section 1310 functions as a finder that displays the subject as an electronic image. In addition, a light reception unit 1304, which includes an optical lens (an image capturing optical system), the CCD, and the like, is provided on the front surface side (the far side in the drawing) of the case 1302. When a photographer confirms a subject image that is displayed on the display section 1310, and holds down a shutter button 1306, the image capturing signal of the CCD at that point in time is transmitted to and stored in a memory 1308.

In addition, in the digital still camera 1300, a video signal output terminal 1312 and an input and output terminal for data communication 1314, are provided on a side surface of the case 1302. Further, a television monitor 1430 and a personal computer 1440 are respectively connected to the video signal output terminal 1312 and the input and output terminal for data communication 1314 according to necessity. Furthermore, the image capturing signal that is stored in the memory 1308 has a configuration that is output to the television monitor 1430, the personal computer 1440, and the like, as a result of a predetermined operation. The electronic device 100 (an acceleration sensor) is built into this kind of digital still camera 1300.

Since such electronic apparatuses are provided with the above-mentioned electronic device 100 (an acceleration sensor), the effects described in the above-mentioned embodiment are exhibited, and therefore, miniaturization is achieved and the reliability thereof is excellent. Additionally, examples of other electronic apparatuses that are provided with the above-mentioned electronic device 100 include an ink jet type discharging apparatus (for example, an ink jet printer), a laptop type personal computer, a television, a video camera, a video tape recorder, various navigation apparatuses, a pager, an electronic notebook (also including devices having a communication function), an electronic dictionary, a calculator, an electronic game machine, a word processor, a workstation, a picture phone, an antitheft television monitor, an electron binocular microscope, a POS terminal, medical equipment (for example, an electronic thermometer, a blood pressure meter, a blood glucose meter, an electrocardiogram measuring device, an ultrasonic diagnostic apparatus, and an electronic endoscope), a fish detector, various measurement machines, meters and gages, a flight simulator, and the like. In any of these case, since these electronic apparatuses are provided with the above-mentioned electronic device 100, the effects described in the above-mentioned embodiment are exhibited, and therefore, miniaturization is achieved and the reliability thereof is excellent.

Moving Body

Figure 13:
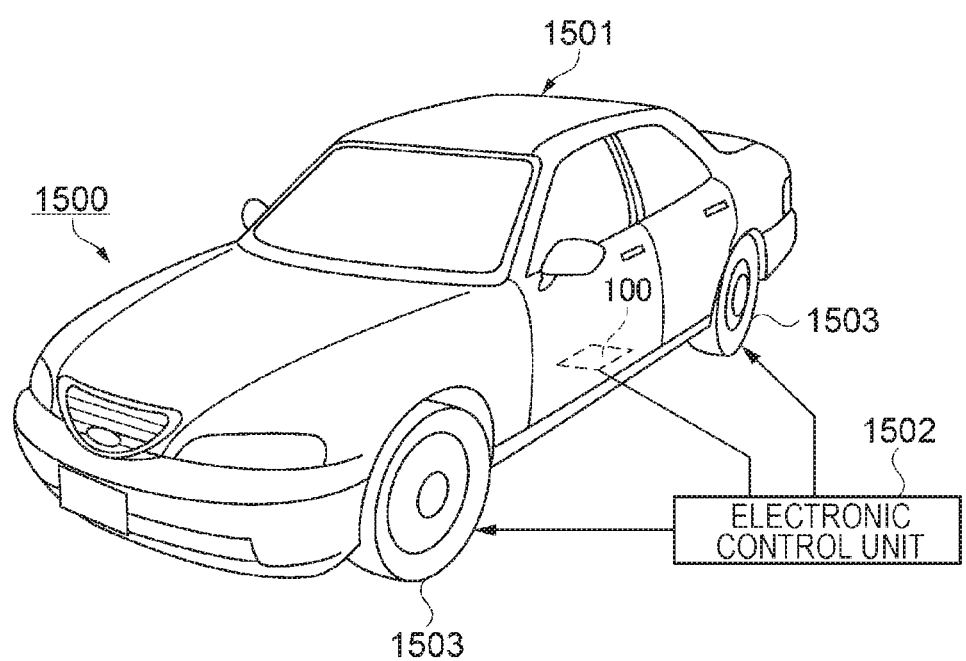
FIG. 13 is a perspective view that schematically shows an automobile as an example of a moving body that is provided with an electronic device.

Next, a moving body that is provided with the above-mentioned electronic device 100 will be described. FIG. 13 is a perspective view that schematically shows an automobile as an example of a moving body. The electronic device 100 (an acceleration sensor) is built into an automobile 1500. For example, as shown in the drawing, in the automobile 1500 as a moving body, an electronic control unit 1502, into which an acceleration sensor 1 is built, and which controls tires 1503, and the like, is installed in a vehicle body 1501. As a result of this, since the automobile 1500 is provided with the above-mentioned electronic device 100 (the acceleration sensor), the effects described in the above-mentioned embodiment are exhibited, and therefore, the reliability thereof is excellent. Additionally, the electronic device 100 (the acceleration sensor) can also be adopted widely in electronic control units (ECUs) such as keyless entry, immobilizer, car navigation system, car air conditioning, anti-lock brake system (ABS), air bags, tire pressure monitoring system (TPMS), engine control, battery monitor for hybrid and electric vehicles, and a body attitude control system.

The above-mentioned electronic device is not limited to the above-mentioned automobile 1500, and can also be suitably applied to a self-propelled robot, a self-propelled transport machine, a train, a ship, an airplane, and a posture detection sensor of a moving body including artificial satellites, and the like, and in any of these cases, the effects described in the above-mentioned embodiment are exhibited, and therefore, it is possible to provide a moving body having excellent reliability.

Additionally, the above-mentioned electronic device is not limited to an acceleration sensor, and may be an angular velocity sensor in which the functional element is provided with an angular velocity detection function, a pressure sensor in which the functional element is provided with a pressure detection function, a weight sensor in which the functional element is provided with a weight detection function, a composite sensor in which these sensors (including an acceleration sensor) are combined, or the like.

In addition, the electronic device may be a vibrator in which the functional element is a vibration piece, an oscillator, a frequency-dependent filter, or the like.

The entire disclosure of Japanese Patent Application No. 2015-178230, filed Sep. 10, 2015 is expressly incorporated by reference herein.

What is claimed is:

1. A manufacturing method of an electronic device that includes a process that respectively bonds a second base body which includes silicon, and a third base body which includes silicon, to a first base body which includes an alkali metal ion,
    the method comprising:
    a process that prepares the first base body;
    a process that forms a protective layer on at least a portion of the first base body to which the third base body is to be bonded;
    a process that performs first bonding of the second base body to the first base body;
    a process that performs a first etching of the second base body bonded by the first bonding;
    a process that removes the protective layer using a second etching; and
    a process that performs second bonding of the third base body to the first base body,
    wherein, in the first etching, an etching rate of the second base body is faster than those of the first base body and the protective layer, and
    wherein, in the second etching, an etching rate of the protective layer is faster than those of the first base body and the second base body.

2. The manufacturing method of an electronic device according to claim 1,
    wherein, in the process that forms the protective layer, the protective layer is formed in circuit form.

3. The manufacturing method of an electronic device according to claim 2, wherein, in the process that forms the protective layer, the protective layer is formed using a diamond-like carbon (DLC) film.

4. The manufacturing method of an electronic device according to claim 2,
wherein, in the second base body, a relief groove section is provided in a region of the second base body that overlaps with the protective layer in plan view, on a bonding surface with the first base body, and
wherein, in the process that performs the first bonding, anodic bonding is performed by disposing the protective layer inside the relief groove section.

5. The manufacturing method of an electronic device according to claim 1,
wherein, in the process that forms the protective layer, the protective layer is formed using a diamond-like carbon (DLC) film.

6. The manufacturing method of an electronic device according to claim 5,
wherein, in the second base body, a relief groove section is provided in a region of the second base body that overlaps with the protective layer in plan view, on a bonding surface with the first base body, and
wherein, in the process that performs the first bonding, anodic bonding is performed by disposing the protective layer inside the relief groove section.

7. The manufacturing method of an electronic device according to claim 1,
wherein, in the second base body, a relief groove section is provided in a region of the second base body that overlaps with the protective layer in plan view, on a bonding surface with the first base body, and
wherein, in the process that performs the first bonding, anodic bonding is performed by disposing the protective layer inside the relief groove section.

8. The manufacturing method of an electronic device according to claim 1,
wherein, in the process that performs the first bonding, the second base body is bonded to the first base body using anodic bonding.

9. The manufacturing method of an electronic device according to claim 1,
wherein, in the process that performs the second bonding, the third base body is bonded to the first base body using anodic bonding.

10. An electronic device comprising:
a first base body that includes an alkali metal ion;
a second base body that is anodically bonded to the first base body; and
a third base body that is anodically bonded to the first base body;
wherein the first base body is provided with a first surface, which includes a bonding portion with the third base body, and a second surface having a more pronounced rough surface state than the first surface, in at least a portion of a peripheral region of the first surface.

11. The electronic device according to claim 10,
wherein, in the peripheral region of the first surface, the second surface is provided between the third base body, which is bonded to the first base body, and the second base body, which is bonded to the first base body.

12. The electronic device according to claim 10,
wherein the first surface includes a bonding surface of the third base body on an inner side thereof in plan view.

13. An electronic apparatus comprising the electronic device according to claim 10.

14. A moving body comprising the electronic device according to claim 10.

* * * * *